United States Patent
Vetury et al.

(10) Patent No.: US 10,615,773 B2
(45) Date of Patent: Apr. 7, 2020

(54) WIRELESS COMMUNICATION INFRASTRUCTURE SYSTEM CONFIGURED WITH A SINGLE CRYSTAL PIEZO RESONATOR AND FILTER STRUCTURE

(71) Applicant: Akoustis, Inc., Huntersville, NC (US)

(72) Inventors: Ramakrishna Vetury, Charlotte, NC (US); Shawn R. Gibb, Huntersville, NC (US); Mark D. Boomgarden, Huntersville, NC (US); Jeffrey B. Shealy, Davidson, NC (US)

(73) Assignee: Akoustis, Inc., Huntersville, NC (US)

( * ) Notice: Subject to any disclaimer, the term of this patent is extended or adjusted under 35 U.S.C. 154(b) by 299 days.

(21) Appl. No.: 15/701,307

(22) Filed: Sep. 11, 2017

(65) Prior Publication Data
US 2019/0081611 A1    Mar. 14, 2019

(51) Int. Cl.
*H03H 9/17* (2006.01)
*H03H 9/02* (2006.01)
(Continued)

(52) U.S. Cl.
CPC .......... *H03H 9/17* (2013.01); *H03H 9/02015* (2013.01); *H03H 9/02574* (2013.01);
(Continued)

(58) Field of Classification Search
CPC combination set(s) only.
See application file for complete search history.

(56) References Cited

U.S. PATENT DOCUMENTS

| | | |
|---|---|---|
| 5,231,327 A | 7/1993 | Ketcham |
| 5,894,647 A | 4/1999 | Lakin |
| (Continued) | | |

FOREIGN PATENT DOCUMENTS

| | | |
|---|---|---|
| JP | 2009100197 A | 5/2009 |
| JP | 2010-068109 A | 3/2010 |
| (Continued) | | |

OTHER PUBLICATIONS

International Search Report and Written Opinion for PCT/US2018/050521 dated Jan. 28, 2019.
(Continued)

*Primary Examiner* — Bryan P Gordon
(74) *Attorney, Agent, or Firm* — Richard T. Ogawa; Ogawa P.C.

(57) ABSTRACT

A system for a wireless communication infrastructure using single crystal devices. The wireless system can include a controller coupled to a power source, a signal processing module, and a plurality of transceiver modules. Each of the transceiver modules includes a transmit module configured on a transmit path and a receive module configured on a receive path. The transmit modules each include at least a transmit filter having one or more filter devices, while the receive modules each include at least a receive filter. Each of these filter devices includes a single crystal acoustic resonator device with at least a first electrode material, a single crystal material, and a second electrode material. Wireless infrastructures using the present single crystal technology perform better in high power density applications, enable higher out of band rejection (OOBR), and achieve higher linearity as well.

20 Claims, 33 Drawing Sheets

(51) Int. Cl.
- *H04B 1/38* (2015.01)
- *H04B 1/04* (2006.01)
- *H04B 1/00* (2006.01)
- *H03H 3/02* (2006.01)
- *H03H 9/05* (2006.01)
- *H03H 9/10* (2006.01)

(52) U.S. Cl.
CPC ........... *H04B 1/005* (2013.01); *H04B 1/0483* (2013.01); *H04B 1/38* (2013.01); *H03H 3/02* (2013.01); *H03H 9/0514* (2013.01); *H03H 9/1014* (2013.01); *H03H 2003/023* (2013.01); *H03H 2003/025* (2013.01)

(56) References Cited

U.S. PATENT DOCUMENTS

| | | |
|---|---|---|
| 6,051,907 A | 4/2000 | Ylilammi |
| 6,114,635 A | 9/2000 | Lakin et al. |
| 6,262,637 B1 | 7/2001 | Bradley et al. |
| 6,377,137 B1 | 4/2002 | Ruby |
| 6,384,697 B1 | 5/2002 | Ruby |
| 6,472,954 B1 | 10/2002 | Ruby et al. |
| 6,617,060 B2 | 9/2003 | Weeks, Jr. et al. |
| 6,812,619 B1 | 11/2004 | Kaitila et al. |
| 6,841,922 B2 | 1/2005 | Aigner et al. |
| 6,864,619 B2 | 3/2005 | Aigner et al. |
| 6,879,224 B2 | 4/2005 | Frank |
| 6,909,340 B2 | 6/2005 | Aigner et al. |
| 6,933,807 B2 | 8/2005 | Marksteiner et al. |
| 7,112,860 B2 | 9/2006 | Saxler |
| 7,250,360 B2 | 7/2007 | Shealy et al. |
| 7,268,436 B2 | 9/2007 | Aigner et al. |
| 7,365,619 B2 | 4/2008 | Aigner et al. |
| 7,514,759 B1 | 4/2009 | Mehta et al. |
| 7,875,910 B2 | 1/2011 | Sheppard et al. |
| 7,982,363 B2 | 7/2011 | Chitnis |
| 8,304,271 B2 | 11/2012 | Huang et al. |
| 2005/0255234 A1 | 11/2005 | Kanda et al. |
| 2008/0284541 A1 | 11/2008 | Chitnis |
| 2009/0033177 A1 | 2/2009 | Itaya et al. |
| 2011/0114968 A1 | 5/2011 | Sheppard et al. |
| 2012/0287575 A1 | 11/2012 | Nelson |
| 2014/0218133 A1* | 8/2014 | Jian ............ H03H 9/02992 333/193 |
| 2015/0033520 A1* | 2/2015 | Riaziat ............ H01L 41/313 29/25.35 |
| 2015/0288346 A1* | 10/2015 | Nakamura ......... H03H 9/6483 333/133 |
| 2016/0028367 A1 | 1/2016 | Shealy |
| 2016/0036414 A1* | 2/2016 | Hamaoka ........... H03H 9/1064 333/133 |
| 2016/0036580 A1* | 2/2016 | Shealy ............ H04L 5/08 370/297 |
| 2018/0123565 A1* | 5/2018 | Takamine ........... H03H 9/145 |

FOREIGN PATENT DOCUMENTS

| | | |
|---|---|---|
| WO | WO 2005/034349 A1 | 4/2005 |
| WO | 2016122877 A1 | 8/2016 |

OTHER PUBLICATIONS

International Search Report for PCT/US2015/034560, dated Sep. 18, 2015.

* cited by examiner

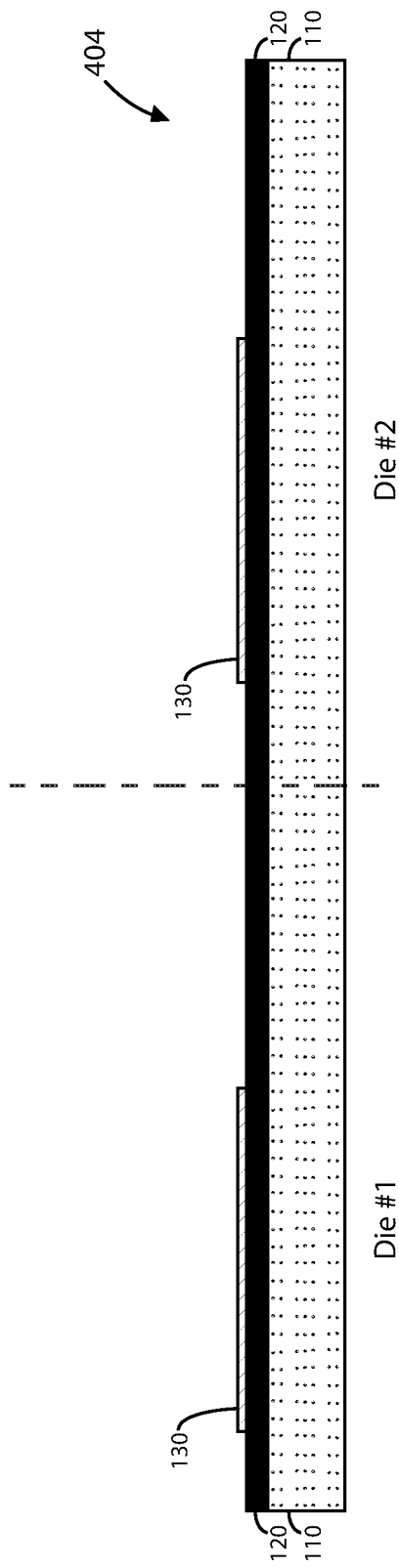
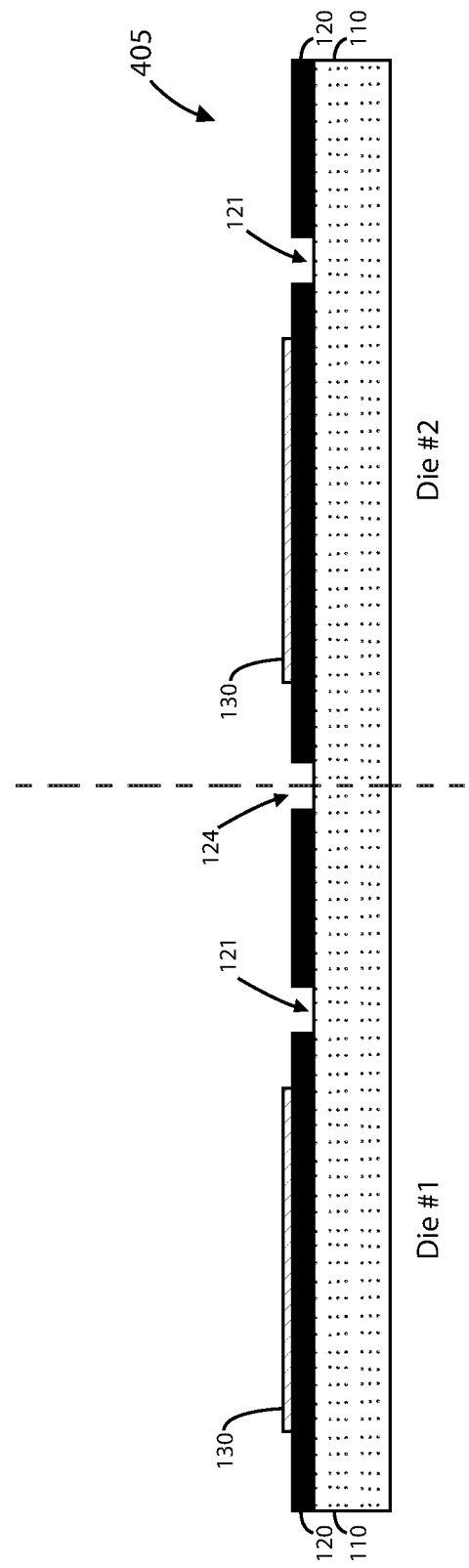

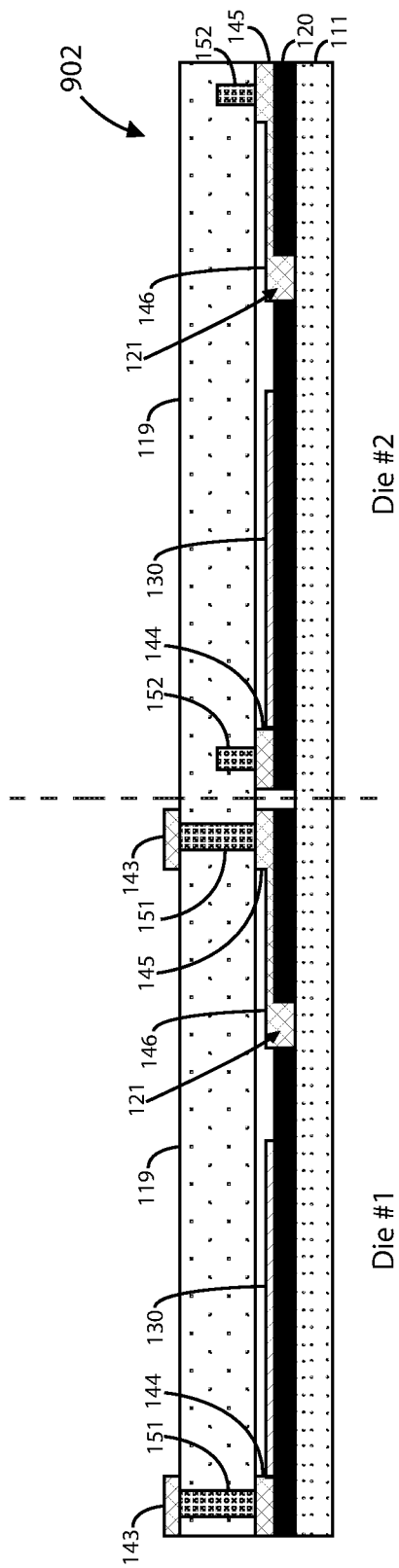
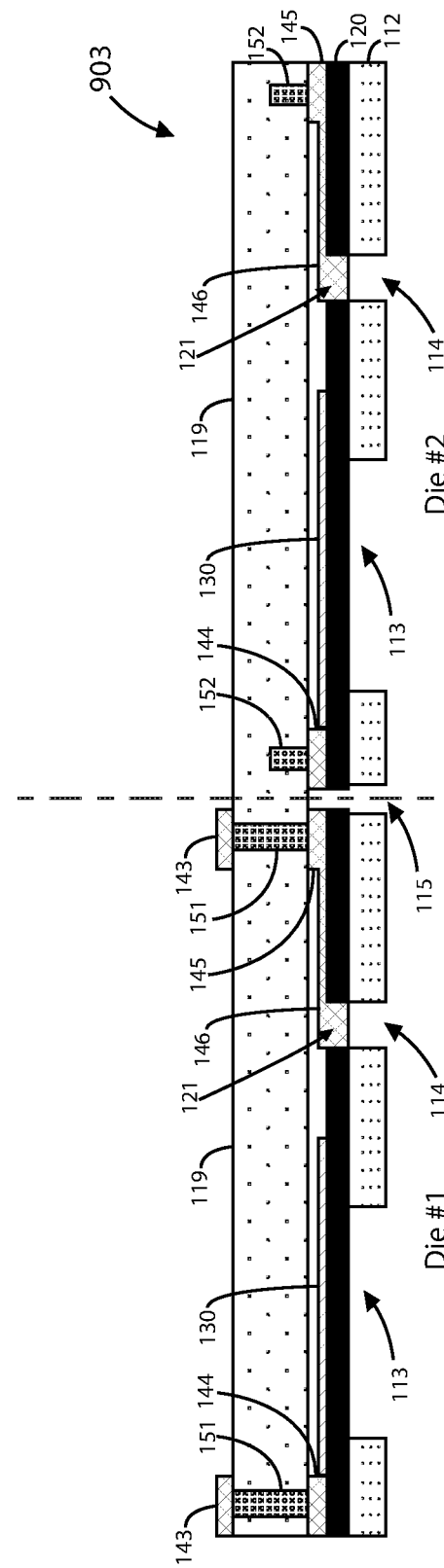
FIG. 9B
FIG. 9C

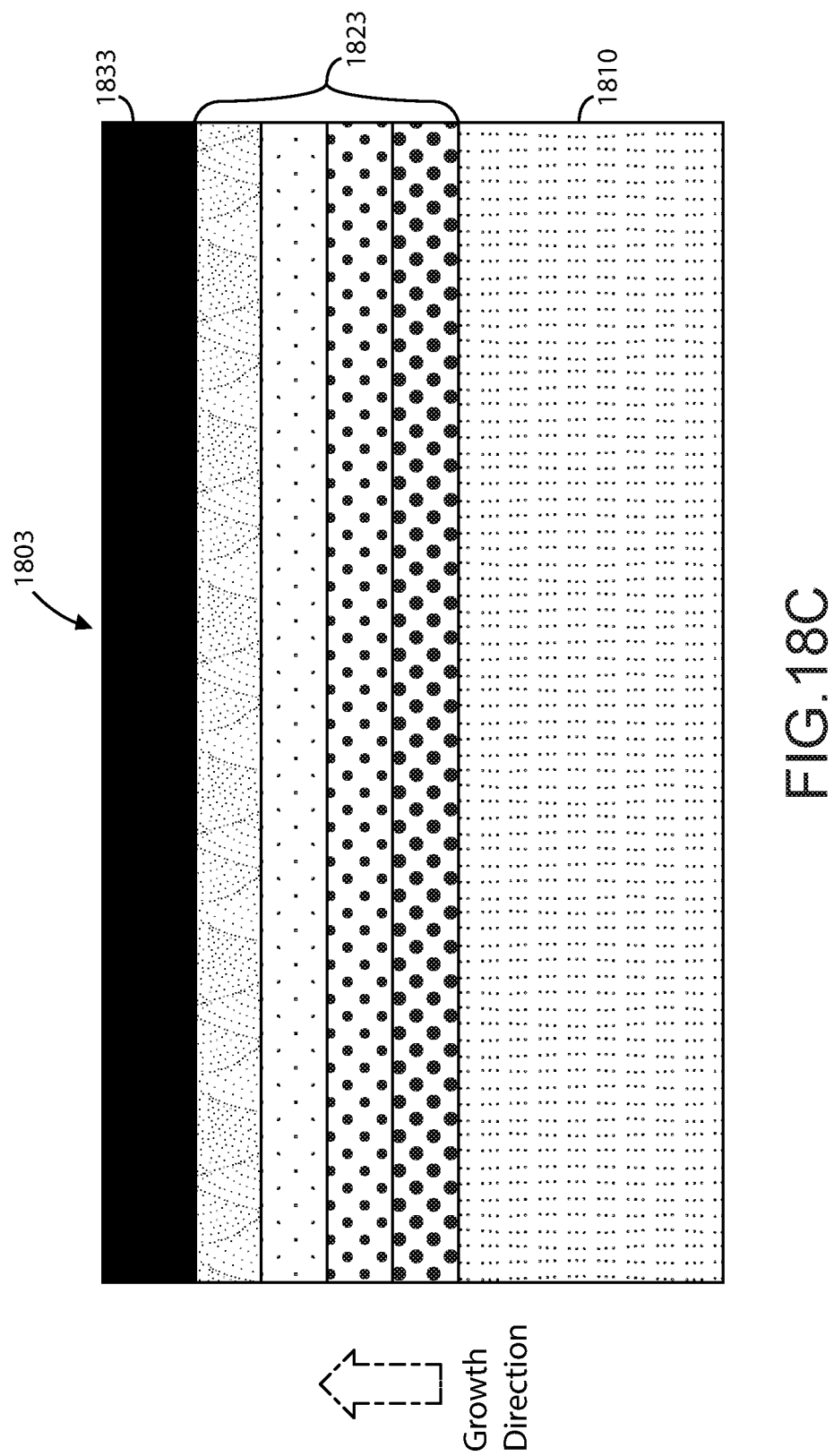

WIRELESS COMMUNICATION INFRASTRUCTURE SYSTEM CONFIGURED WITH A SINGLE CRYSTAL PIEZO RESONATOR AND FILTER STRUCTURE

CROSS-REFERENCES TO RELATED APPLICATIONS

The present application incorporates by reference, for all purposes, the following concurrently filed patent applications, all commonly owned: U.S. patent application Ser. No. 14/298,057, titled "RESONANCE CIRCUIT WITH A SINGLE CRYSTAL CAPACITOR DIELECTRIC MATERIAL," filed Jun. 6, 2014 (now U.S. Pat. No. 9,673,384 issued Jun. 6, 2017), U.S. patent application Ser. No. 14/298,076, titled "METHOD OF MANUFACTURE FOR SINGLE CRYSTAL CAPACITOR DIELECTRIC FOR A RESONANCE CIRCUIT," filed Jun. 6, 2014 (now U.S. Pat. No. 9,537,465 issued Jan. 3, 2017), U.S. patent application Ser. No. 14/298,100, titled "INTEGRATED CIRCUIT CONFIGURED WITH TWO OR MORE SINGLE CRYSTAL ACOUSTIC RESONATOR DEVICES," filed Jun. 6, 2014 (now U.S. Pat. No. 9,571,061 issued Feb. 14, 2017), U.S. patent application Ser. No. 14/341,314, titled "WAFER SCALE PACKAGING," filed Jul. 25, 2014, U.S. patent application Ser. No. 14/449,001, titled "MOBILE COMMUNICATION DEVICE CONFIGURED WITH A SINGLE CRYSTAL PIEZO RESONATOR STRUCTURE," filed Jul. 31, 2014 (now U.S. Pat. No. 9,716,581 issued Jul. 25, 2017), U.S. patent application Ser. No. 14/469,503, titled "MEMBRANE SUBSTRATE STRUCTURE FOR SINGLE CRYSTAL ACOUSTIC RESONATOR DEVICE," filed Aug. 26, 2014, and U.S. patent application Ser. No. 15/068,510, titled "METHOD OF MANUFACTURE FOR SINGLE CRYSTAL ACOUSTIC RESONATOR DEVICES USING MICRO-VIAS," filed Mar. 11, 2016, U.S. patent application Ser. No. 15/221,358, titled "METHOD OF MANUFACTURE FOR SINGLE CRYSTAL ACOUSTIC RESONATOR DEVICES USING MICRO-VIAS," filed Jul. 27, 2016, and U.S. patent application Ser. No. 15/341,218, titled "STRUCTURE AND METHOD OF MANUFACTURE FOR ACOUSTIC RESONATOR OR FILTER DEVICES USING IMPROVED FABRICATION CONDITIONS AND PERIMETER STRUCTURE MODIFICATIONS," filed Nov. 2, 2016.

BACKGROUND OF THE INVENTION

According to the present invention, techniques generally related to electronic devices are provided. More particularly, the present invention provides techniques related to methods and devices related to wireless communication systems using single crystal devices, bulk acoustic wave resonator devices, single crystal filter and resonator devices, Power Amplifiers (PA), Low Noise Amplifiers (LNA), switches and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2 B per annum within the next few years. Coexistence of new and legacy standards and thirst for higher data rate requirements is driving wireless communication complexity in smartphones. Unfortunately, limitations exist with conventional wireless technology that is problematic, and may lead to drawbacks in the future.

From the above, it is seen that techniques for improving electronic communication devices are highly desirable.

BRIEF SUMMARY OF THE INVENTION

According to the present invention, techniques generally related to electronic devices are provided. More particularly, the present invention provides techniques related to methods and devices related to wireless communication systems using single crystal devices, bulk acoustic wave resonator devices, single crystal filter and resonator devices, Power Amplifiers (PA), Low Noise Amplifiers (LNA), switches and the like. Merely by way of example, the invention has been applied to a single crystal resonator device for a communication device, mobile device, computing device, among others.

According to an example, the present invention provides a wireless communication infrastructure using single crystal devices. The wireless system can include a controller coupled to a power source, a signal processing module, and a plurality of transceiver modules. Each of the transceiver modules includes a transmit module configured on a transmit path and a receive module configured on a receive path. The transmit modules each include at least a transmit filter having one or more filter devices, while the receive modules each include at least a receive filter. In a specific example, the power source can include a power supply, a battery-based power supply, or a power supply combined with a battery backup, or the like. The signal processing module can be a baseband signal processing module. Further, the transceiver modules can include RF transmit and receive modules. Those of ordinary skill in the art will recognize other variations, modifications, and alternatives.

Each of these filter devices includes a single crystal acoustic resonator device. As an example, each device can include a first electrode material, a single crystal material, and a second electrode material. The first electrode material can be coupled to a portion of the substrate. Also, a reflector region can be configured to the first electrode material. The single crystal material can be formed overlying an exposed portion of the substrate surface region and coupled to the first electrode material. The second electrode material can be formed overlying the single crystal material. Variations, modifications, and alternatives of these devices are as previously discussed.

An antenna is coupled to each of the transmit modules and each of the receive modules. An antenna control module is coupled to each of the receive path, the transmit path, and the transceiver modules. This antenna control module is configured to select one of the receive paths or one of the transmit paths in facilitating communication type operations.

In an example, a power amplifier module can be coupled to the controller, the power source, and the transceiver modules. The power amplifier module can be configured on each of the transmit paths and each of the receive paths. This power amplifier module can also include a plurality of communication bands, each of which can have a power amplifier. The filters of the transceiver modules can each be configured to one or more of the communication bands.

One or more benefits are achieved over pre-existing techniques using the present invention. Wireless infrastructures using the present single crystal technology achieves better thermal conductivity, which enables such infrastructures to perform better in high power density applications. The present single crystal infrastructures also provide low loss, thus enabling higher out of band rejection (OOBR). With better thermal properties and resilience over higher power, such single crystal infrastructures achieve higher linearity as well. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4D and 4E are simplified diagrams illustrating an alternative method for conducting the method step of forming a topside micro-trench as described in FIG. 4A.

FIGS. 9B and 9C are simplified diagrams illustrating an alternative method for conducting the method step of forming backside trenches, as described in FIG. 9A, and simultaneously singulating a seed substrate according to an embodiment of the present invention.

FIG. 18C is a simplified diagram illustrating a method for forming a piezoelectric layer for an acoustic resonator device according to an example of the present invention.

DETAILED DESCRIPTION OF THE INVENTION

Figure 1A:
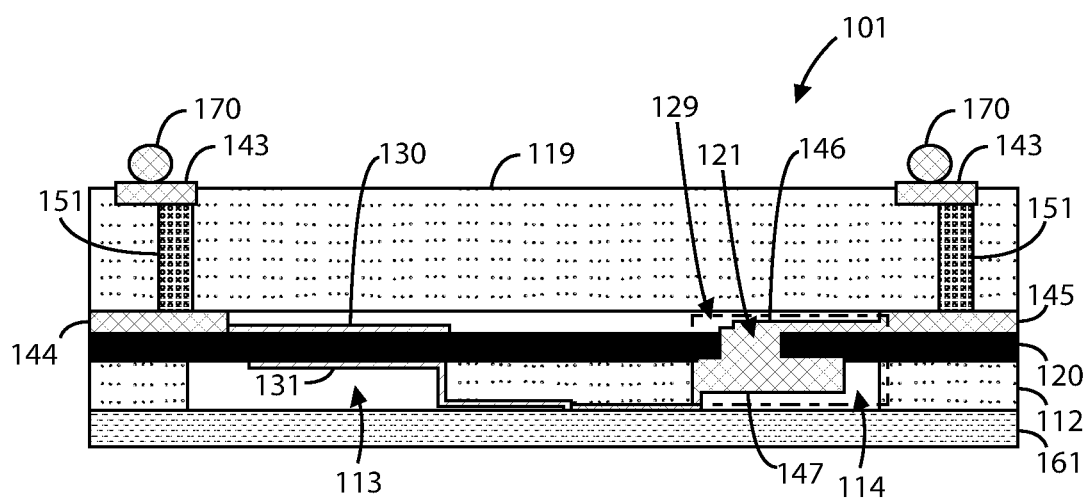
FIG. 1A is a simplified diagram illustrating an acoustic resonator device having topside interconnections according to an example of the present invention.

According to the present invention, techniques generally related to electronic devices are provided. More particularly, the present invention provides techniques related to methods and devices related to wireless communication systems using single crystal devices, bulk acoustic wave resonator devices, single crystal filter and resonator devices, Power Amplifiers (PA), Low Noise Amplifiers (LNA), switches and the like. Merely by way of example, the invention has been applied to a single crystal resonator device for a communication device, mobile device, computing device, among others.

Typically, base stations provide the connections between mobile phones and a wider telephone network for voice and data. These base stations are characterized as macro, micro, nano, pico, or femto depending on the range of wireless coverage. Macro-cells are base stations covering a service provider's largest coverage areas and are usually situated in rural areas and near highways. Micro-cells are low-power base stations covering areas where a mobile network requires additional coverage to maintain quality of service to subscribers. These micro-cells are usually situated in suburban and urban areas. Pico-cells are smaller base stations providing more localized coverage in areas with many users where network quality is poor. Pico-cells are usually placed inside buildings. Macro base stations may have ranges of up to 35 kilometers (about 22 miles). By comparison, pico-cells may have ranges of 200 meters or less, and femto-cells may have ranges of 10 to 40 meters.

These base stations operate at significantly higher power levels, especially compared to mobile devices. Whereas a mobile phone may typically put out 1 milliWatt (mW) to 1 Watt (W), a base station may put out anywhere from a few Watts to hundreds of Watts. With smaller device sizes being highly desirable in the industry (e.g., smaller than 3×3 sq. mm for wireless infrastructure and smaller than 1.5×1.5 sq. mm for mobile devices), the power density, i.e., RF power per unit area, of wireless infrastructures requirements are much higher than mobile devices as well. Single crystal devices have better thermal conductivity compared to conventional devices, which means wireless infrastructures implementing single crystal devices, e.g., filters, are better suited for high power density operations.

Wireless infrastructures using single crystal devices benefit from higher Out of Band Rejection (OOBR), which is the amount that an undesired signal is attenuated compared to a desired signal. In wireless infrastructure filters, the specification for OOBR can be 10 to 20 dB more stringent than for mobile device filters. Typically, filter designs require a trade-off between insertion loss and OOBR. Thus, improving OOBR without degrading insertion loss requires a lower loss RF filter technology, i.e., single crystal RF filter technology.

The improved thermal conductivity of the single crystal devices also enables present wireless infrastructures to operate with higher linearity. The root causes of non-linearity are changes in the properties of device materials over temperature and power levels. According to examples of the present invention, wireless infrastructures using single crystal device achieve higher linearity due to the improved thermal properties and consistency over higher power levels. The following paragraphs will describe various components of the wireless communication devices and their implementation in a system as a whole.

FIG. 1A is a simplified diagram illustrating an acoustic resonator device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded to the thinned seed substrate 112, underlying the first and second backside trenches 113, 114. Further details relating to the method of manufacture of this device will be discussed starting from FIG. 2.

Figure 1B:
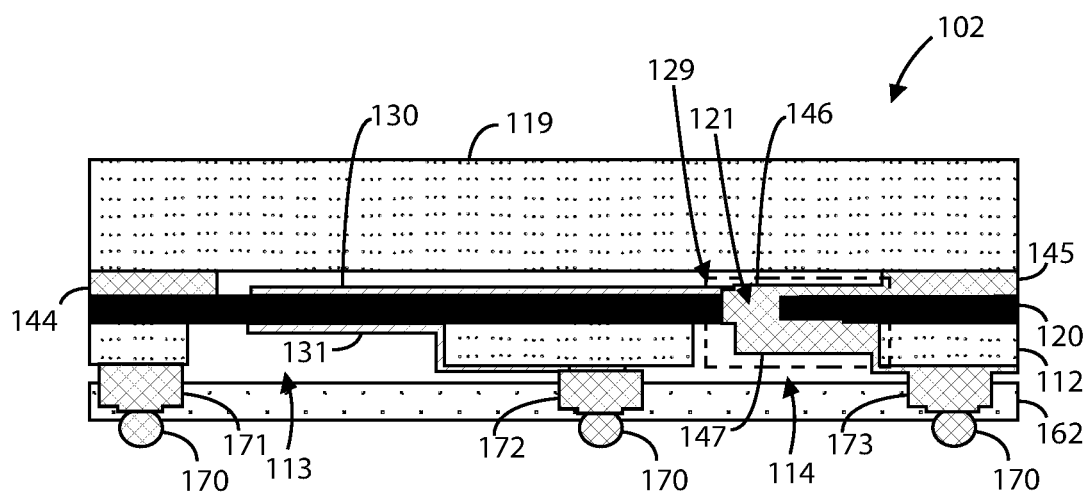
FIG. 1B is a simplified diagram illustrating an acoustic resonator device having bottom-side interconnections according to an example of the present invention.

FIG. 1B is a simplified diagram illustrating an acoustic resonator device 102 having backside interconnections according to an example of the present invention. As shown, device 102 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
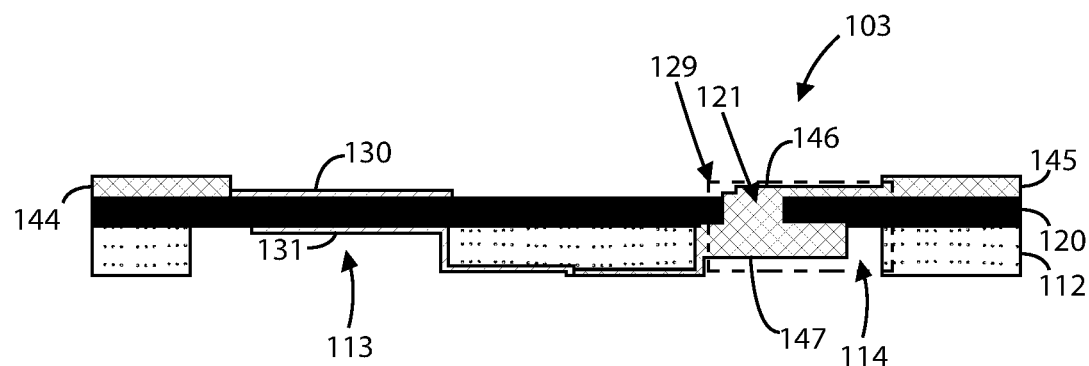
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
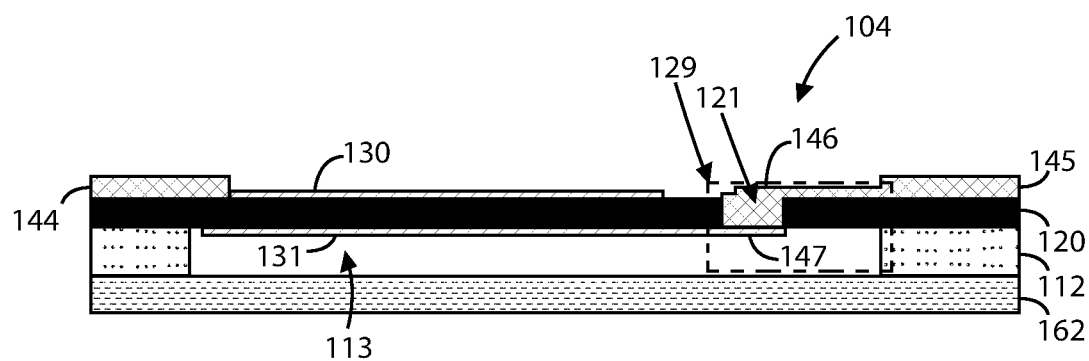
FIG. 1D is a simplified diagram illustrating an acoustic resonator device having interposer/cap-free structure interconnections with a shared backside trench according to an example of the present invention.

FIG. 1D is a simplified diagram illustrating an acoustic resonator device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
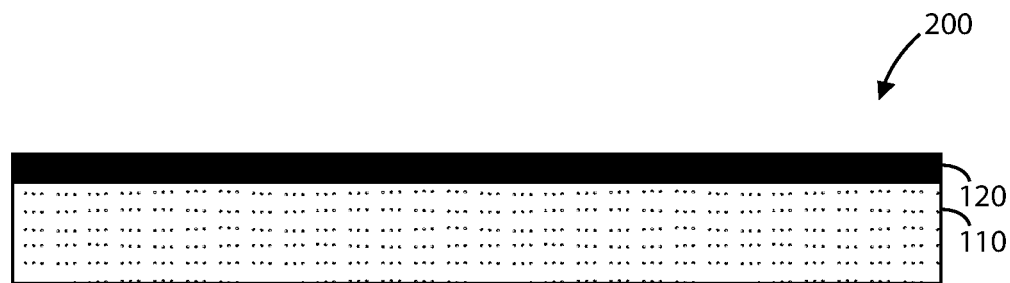
FIGS. 2 and 3 are simplified diagrams illustrating steps for a method of manufacture for an acoustic resonator device according to an example of the present invention.
Figure 3:
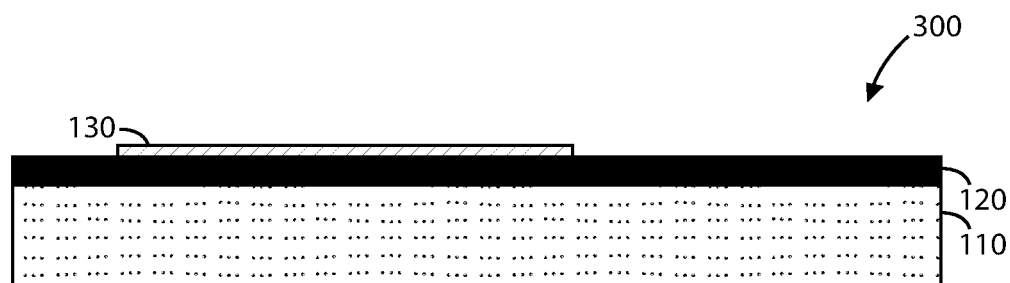

FIGS. 2 and 3 are simplified diagrams illustrating steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 200 includes a seed substrate 110 with a piezoelectric layer 120 formed overlying. In a specific example, the seed substrate can include silicon (Si), silicon carbide (SiC), aluminum oxide (AlO), or single crystal aluminum gallium nitride (GaN) materials, or the like. In a specific example, an SiC substrate can provide better thermal conductivity, which can be desirable depending on the application. The piezoelectric layer 120 can include a piezoelectric single crystal layer or a thin film piezoelectric single crystal layer.

As shown with device 300, FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

Figure 4A:
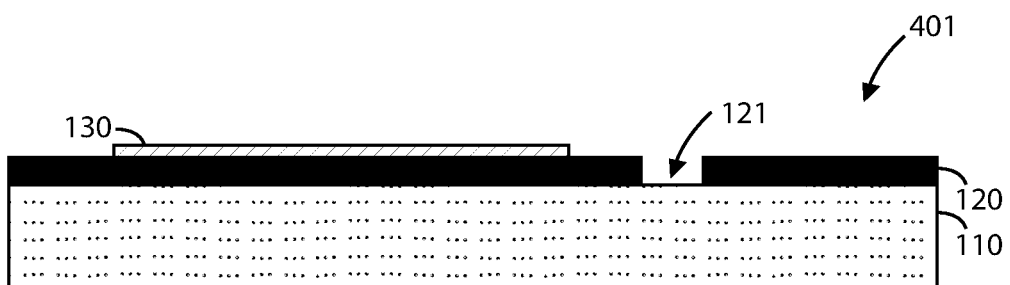
FIG. 4A is a simplified diagram illustrating a step for a method creating a topside micro-trench according to an example of the present invention.
Figure 4B:
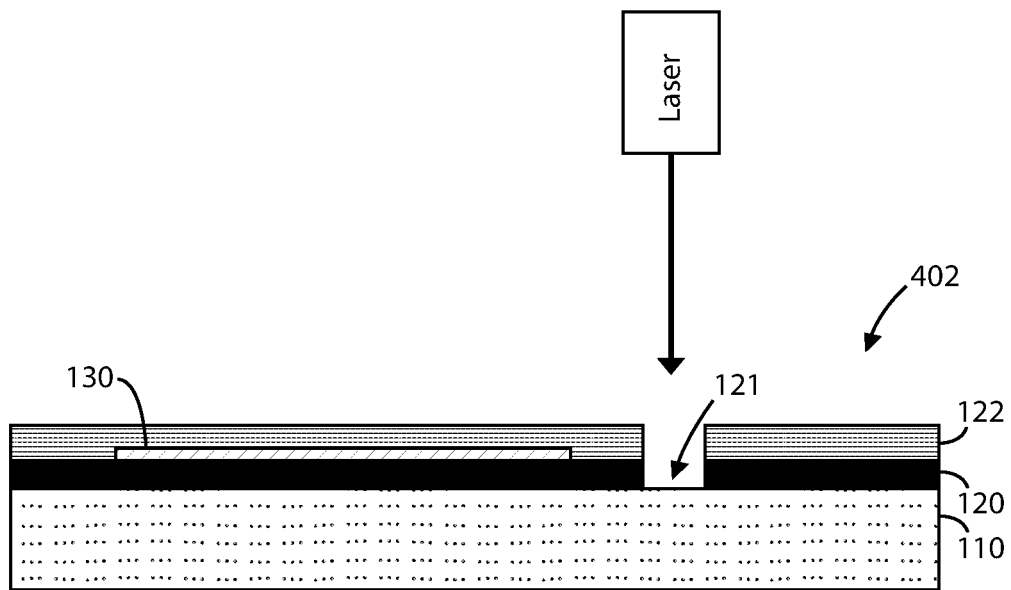
FIGS. 4B and 4C are simplified diagrams illustrating alternative methods for conducting the method step of forming a topside micro-trench as described in FIG. 4A.
Figure 4C:
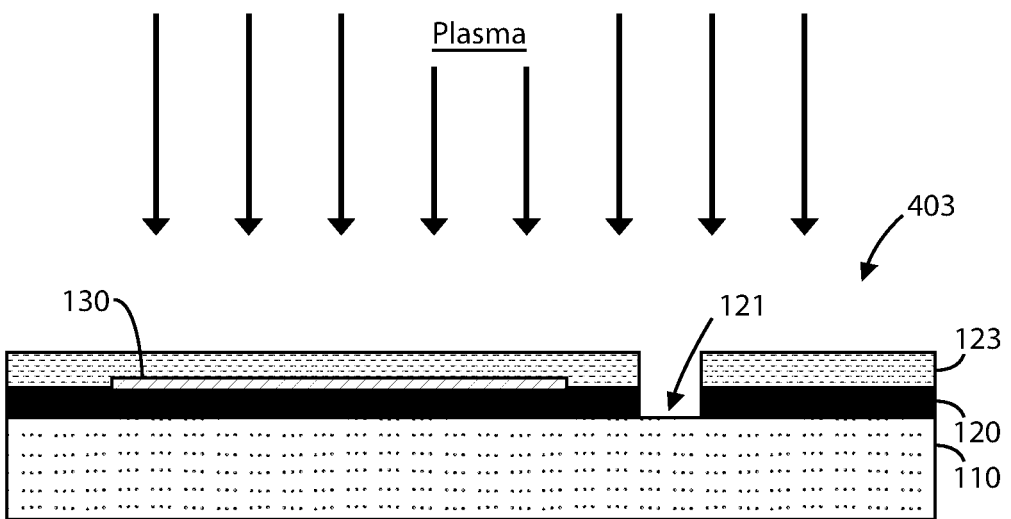
Figure 5:
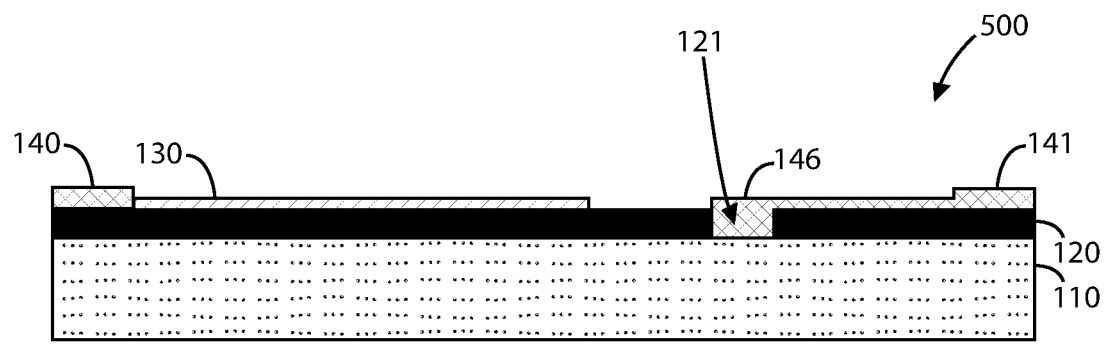
FIGS. 5 to 8 are simplified diagrams illustrating steps for a method of manufacture for an acoustic resonator device according to an example of the present invention.

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown with device 402, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown with device 403, a lithographic masking layer 123 can be formed overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2 of wafer 404, respectively. FIG. 4E shows the process of forming a micro-via 121 on each of these dies of wafer 405 while also etching a scribe line 124 or dicing line. In an example, the etching of the scribe line 124 singulates and relieves stress in the piezoelectric single crystal layer 120.

FIGS. 5 to 8 are simplified diagrams illustrating steps for a method of manufacture for an acoustic resonator device according to an example of the present invention. As shown with device 500, FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

Figure 6:
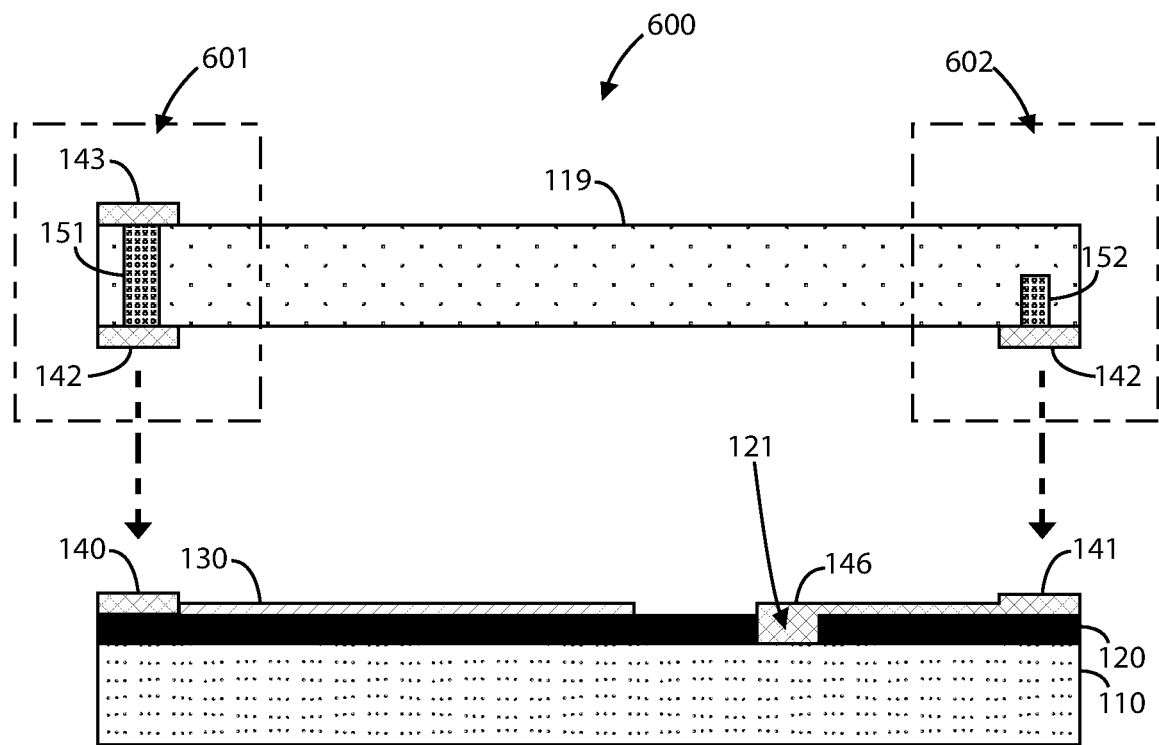

FIG. 6 can represent a method step for preparing the acoustic resonator device for bonding, which can be a hermetic bonding. As shown with device 600, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
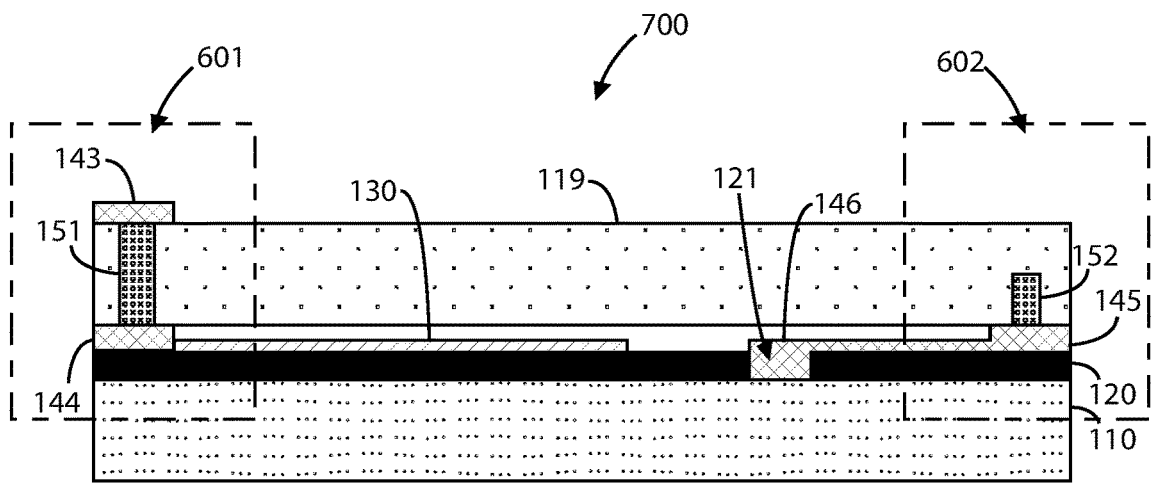
Figure 8:
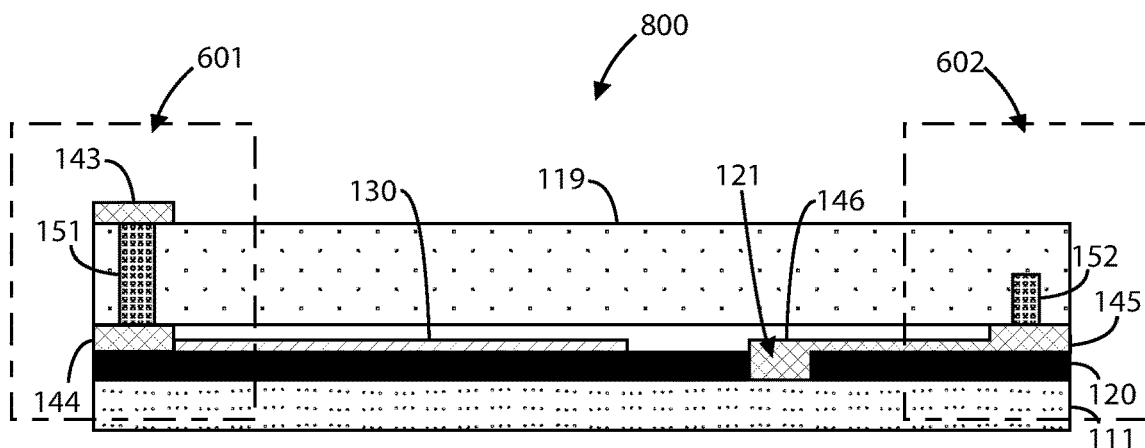

FIG. 7 can represent a method step of bonding the top cap structure to the partially processed acoustic resonator device. As shown with device 700, the interposer substrate 119 is bonded to the piezoelectric layer by the bond pads (140, 142) and the topside metal 141, which are now denoted as bond pad 144 and topside metal 145. This bonding process can be done using a compression bond method or the like. As shown with device 800, FIG. 8 can represent a method step of thinning the seed substrate 110, which is now denoted as thinned seed substrate 111. This substrate thinning process can include grinding and etching processes or the like. In a specific example, this process can include a wafer backgrinding process followed by stress removal, which can involve dry etching, CMP polishing, or annealing processes.

Figure 9A:
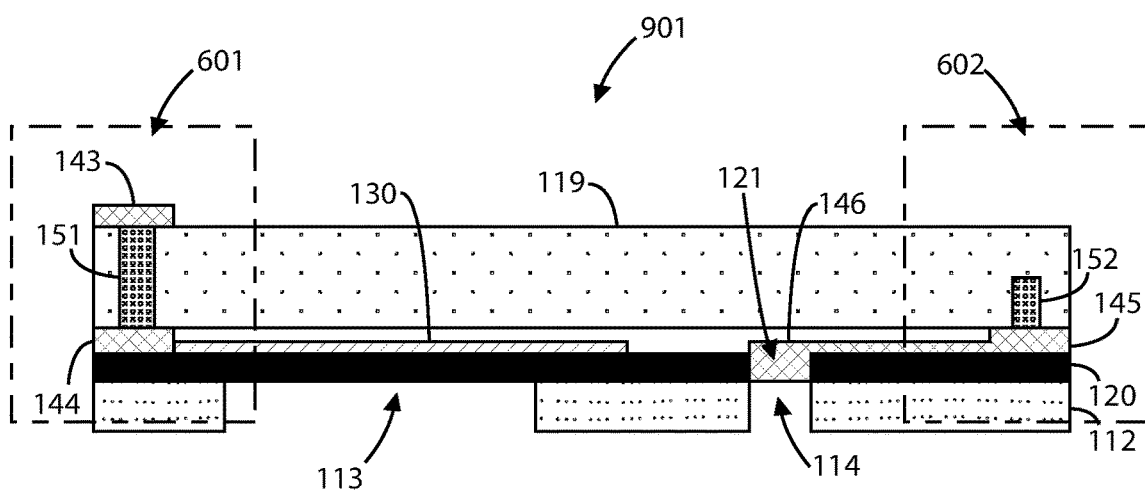
FIG. 9A is a simplified diagram illustrating a method step for forming backside trenches according to an example of the present invention.

FIG. 9A is a simplified diagram illustrating a step for a method of manufacture for an acoustic resonator device 901 according to an example of the present invention. FIG. 9A can represent a method step for forming backside trenches 113 and 114 to allow access to the piezoelectric layer from the backside of the thinned seed substrate 111. In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2 of wafer 902, respectively. FIG. 9C shows the process of forming backside trenches (113, 114) on each of these dies of wafer 903 while also etching a scribe line 115 or dicing line. In an example, the etching of the scribe line 115 provides an optional way to singulate the backside wafer 112.

Figure 10:
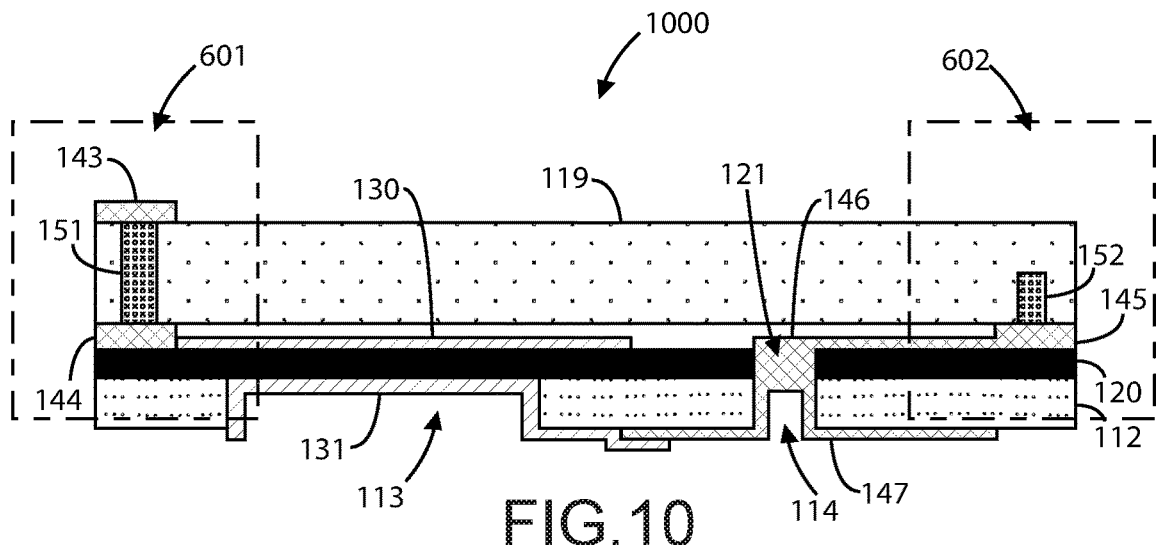
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the acoustic resonator device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
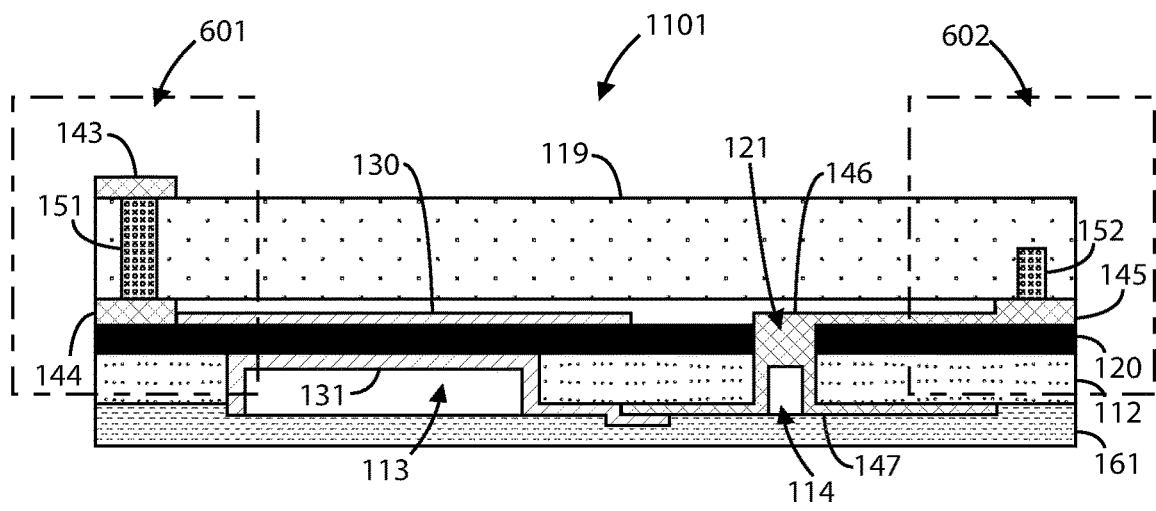
FIGS. 11A and 11B are simplified diagrams illustrating alternative steps for a method of manufacture for an acoustic resonator device according to an example of the present invention.
Figure 11B:
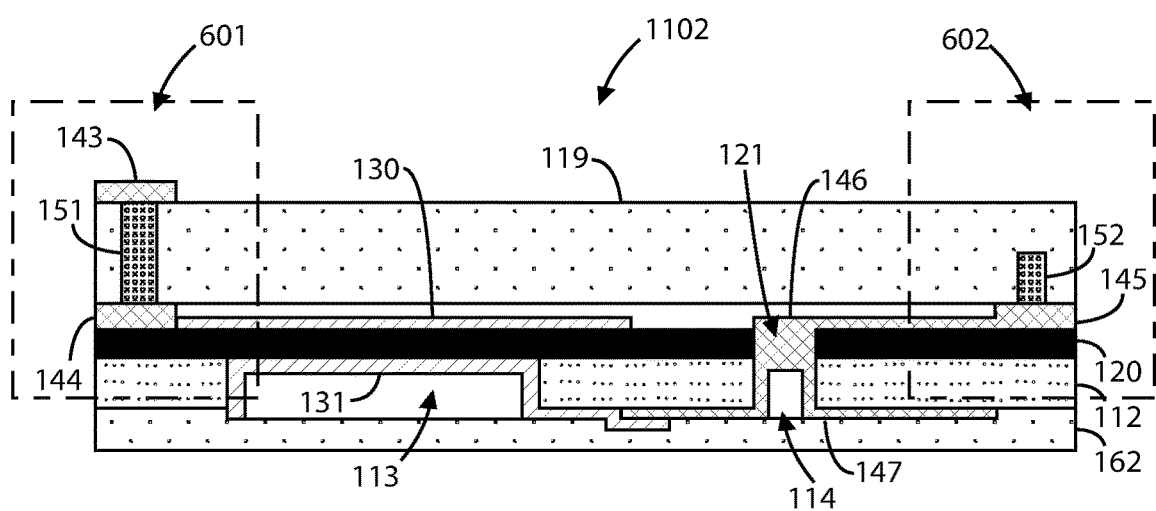

FIGS. 11A and 11B are simplified diagrams illustrating alternative steps for a method of manufacture for an acoustic resonator device according to an example of the present invention. These figures show methods of bonding a backside cap structure underlying the thinned seed substrate 112. In device 1101 of FIG. 11A, the backside cap structure is a dry film cap 161, which can include a permanent photo-imageable dry film such as a solder mask, polyimide, or the like. Bonding this cap structure can be cost-effective and reliable, but may not produce a hermetic seal. In device 1102 FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
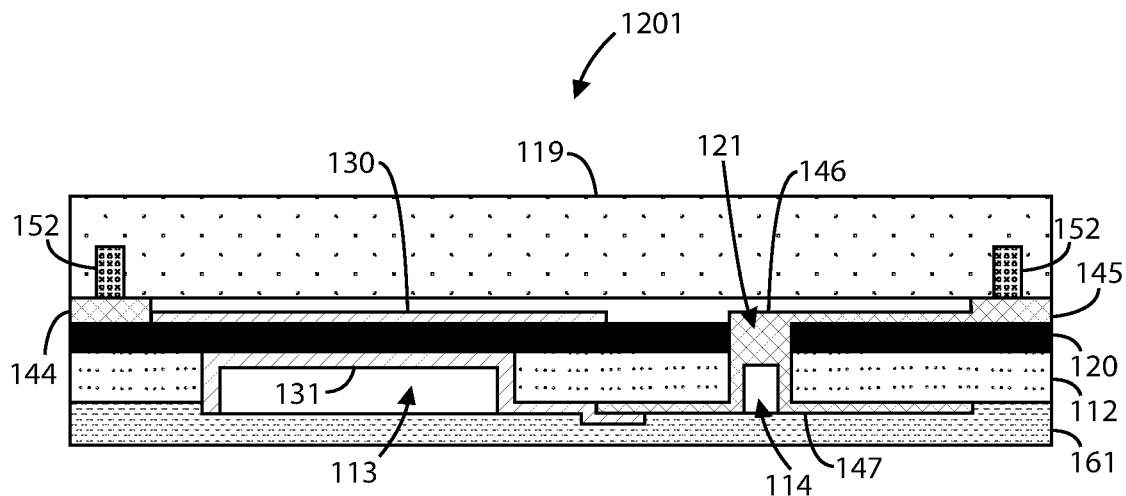
FIGS. 12A to 12E are simplified diagrams illustrating steps for a method of manufacture for an acoustic resonator device using a blind via interposer according to an example of the present invention.
Figure 12B:
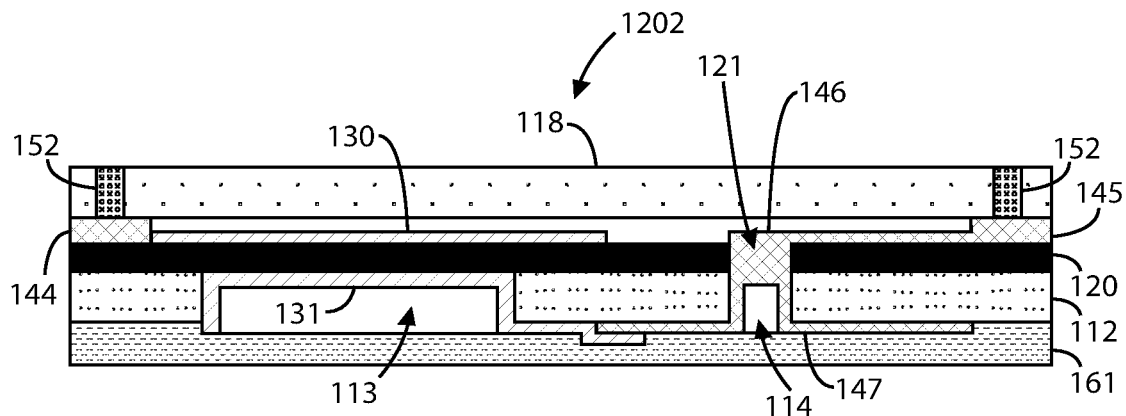
Figure 12C:
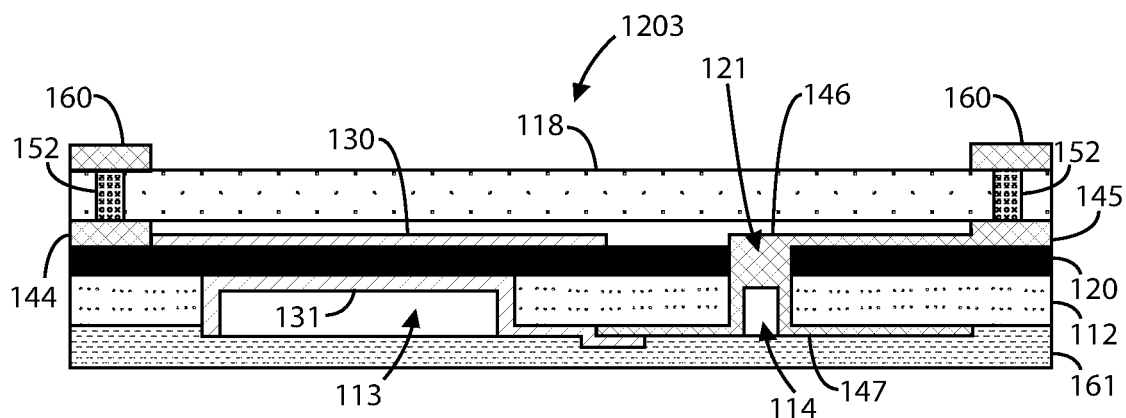
Figure 12D:
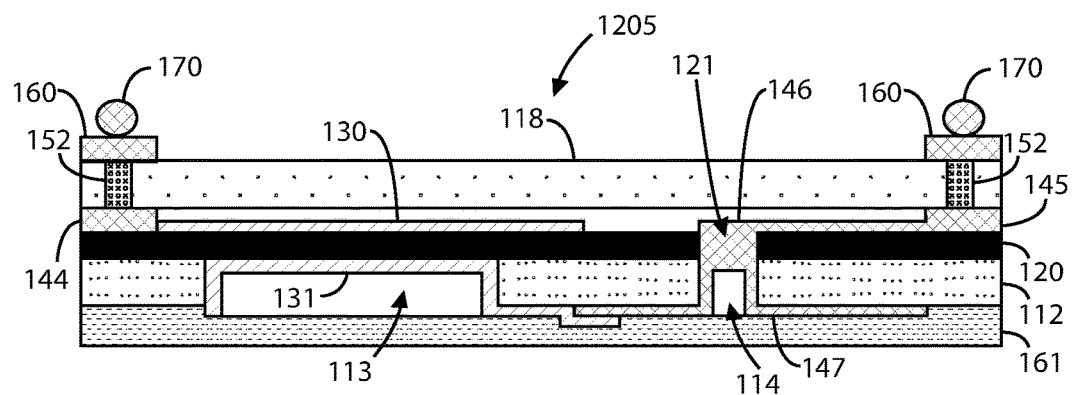
Figure 12E:
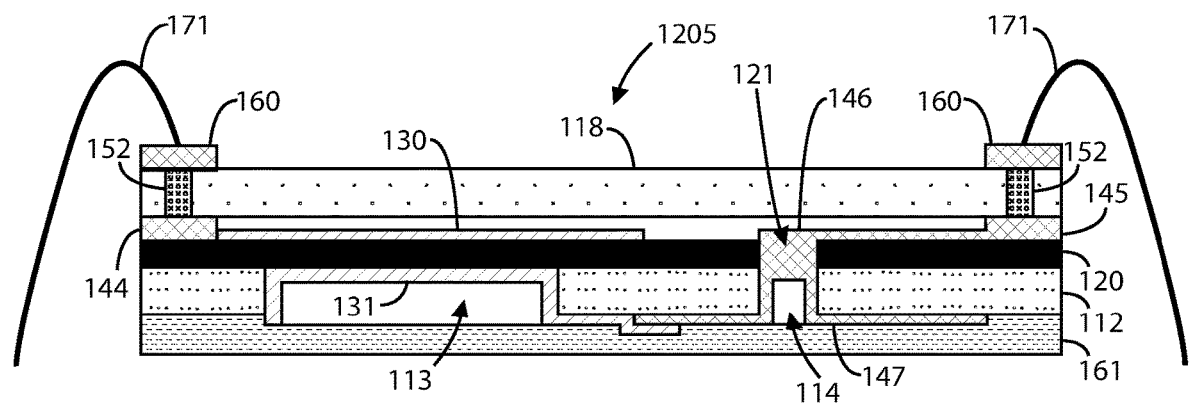

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure. FIG. 12A shows an acoustic resonator device 1201 with blind vias 152 in the top cap structure. In device 1202 of FIG. 12B, the interposer substrate 119 is thinned, which forms a thinned interposer substrate 118, to expose the blind vias 152. This thinning process can be a combination of a grinding process and etching process as described for the thinning of the seed substrate. In device 1203 of FIG. 12C, a redistribution layer (RDL) process and metallization process can be applied to create top cap bond pads 160 that are formed overlying the blind vias 152 and are electrically coupled to the blind vias 152. As shown in device 1205 of FIG. 12D, a ball grid array (BGA) process can be applied to form solder balls 170 overlying and electrically coupled to the top cap bond pads 160. This process leaves the acoustic resonator device ready for wire bonding 171, as shown in device 1205 of FIG. 12E.

In an example, the present invention provides a method of manufacture and structure of a monolithic single-chip single crystal device. The monolithic design uses a common single crystal material layer stack to integrate both passive and active device elements in a single chip. This design can be applied to a variety of device components, such as single crystal bulk acoustic resonators, filters, power amplifiers (PAs), switches, low noise amplifiers (LNAs), and the like.

These components can be integrated as a mobile wireless front-end module (FEM) or other type of FEM. In a specific example, this monolithic single-chip single crystal device can be a single crystal III-nitride single chip integrated front end module (SCIFEM). Furthermore, a CMOS based controller chip can be integrated into a package with the SCIFEM chip to provide a complete communications RF FEM.

Figure 13A:
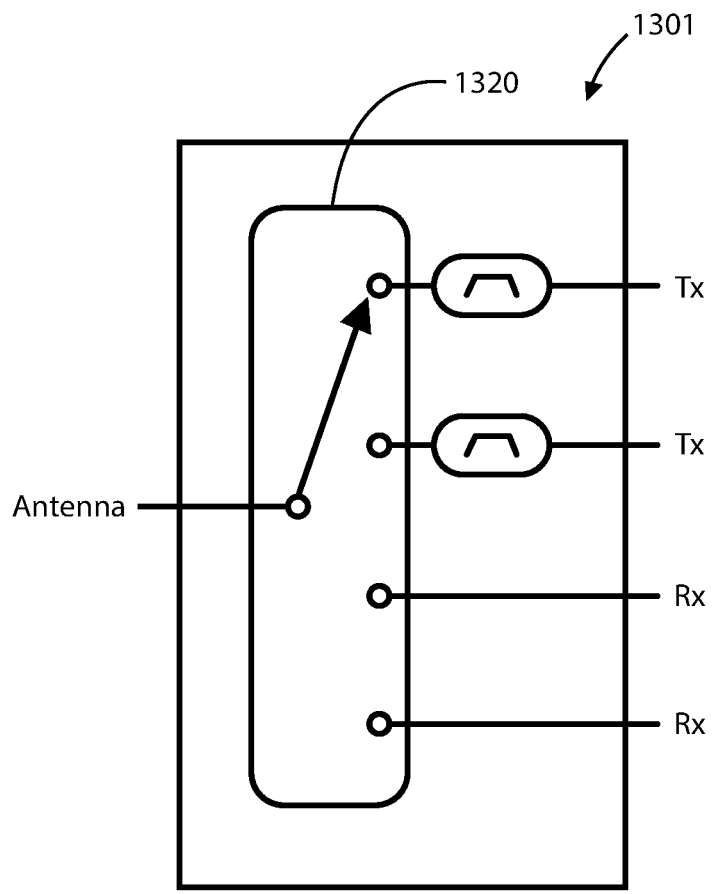
FIGS. 13A through 13E are simplified circuit diagrams illustrating various monolithic single chip single crystal devices according various examples of the present invention.
Figure 13B:
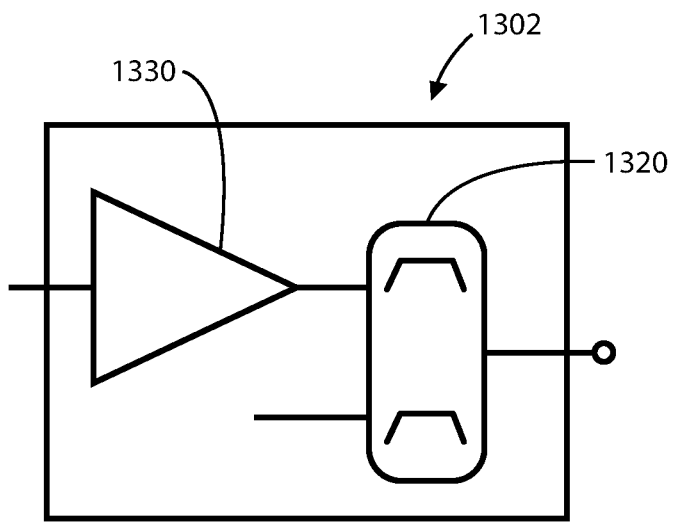
Figure 13C:
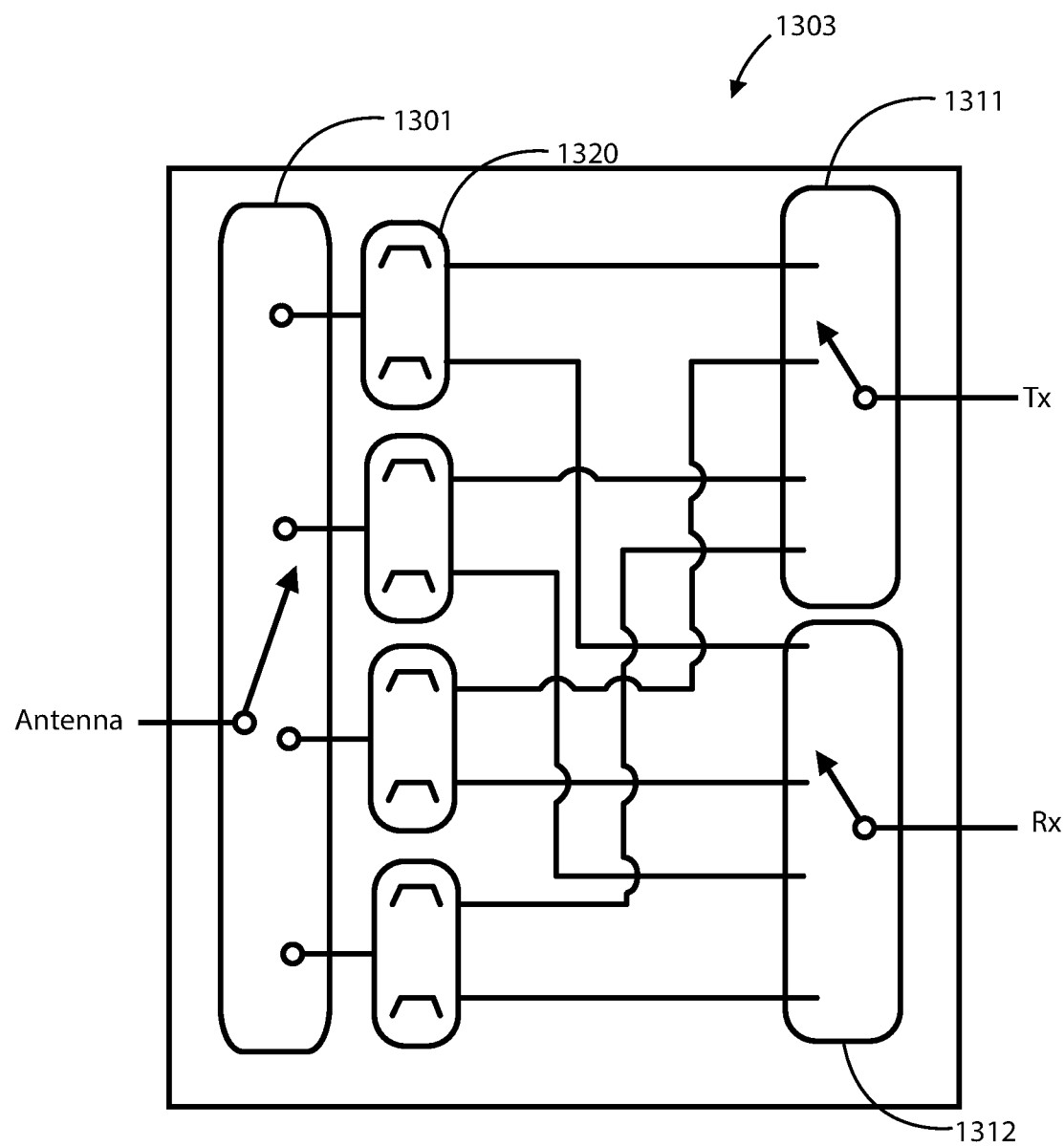
Figure 13D:
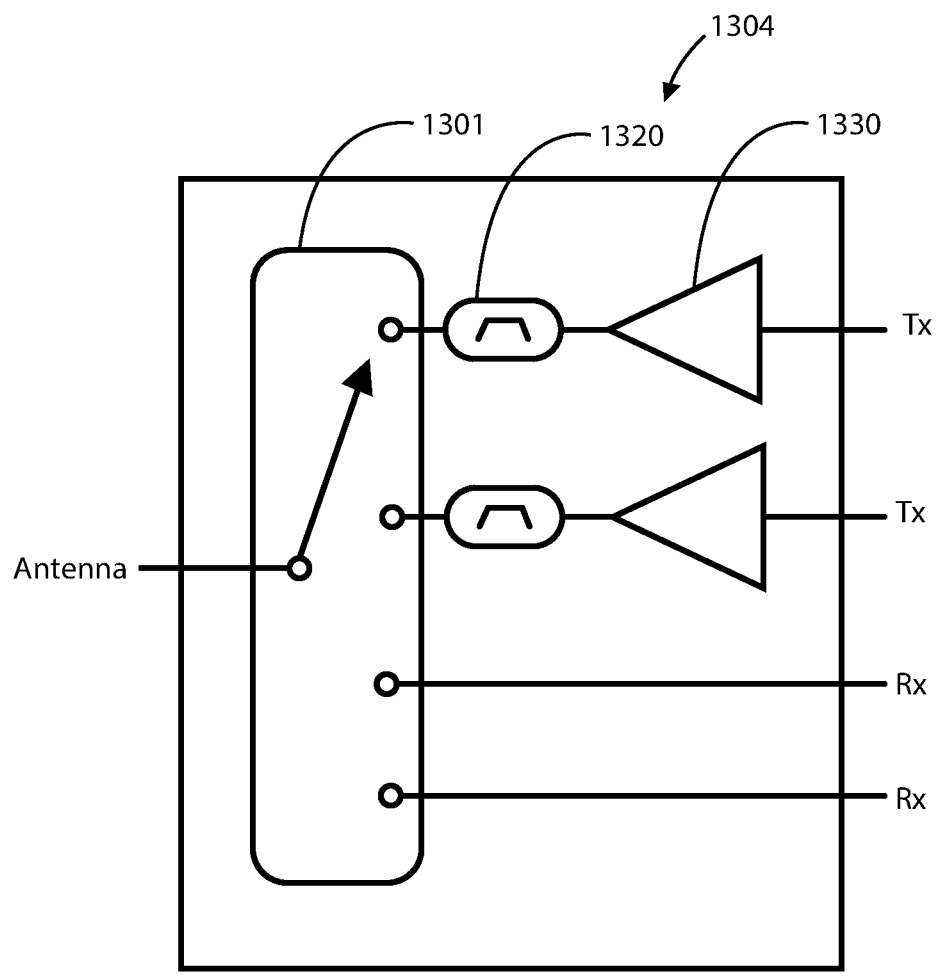
Figure 13E:
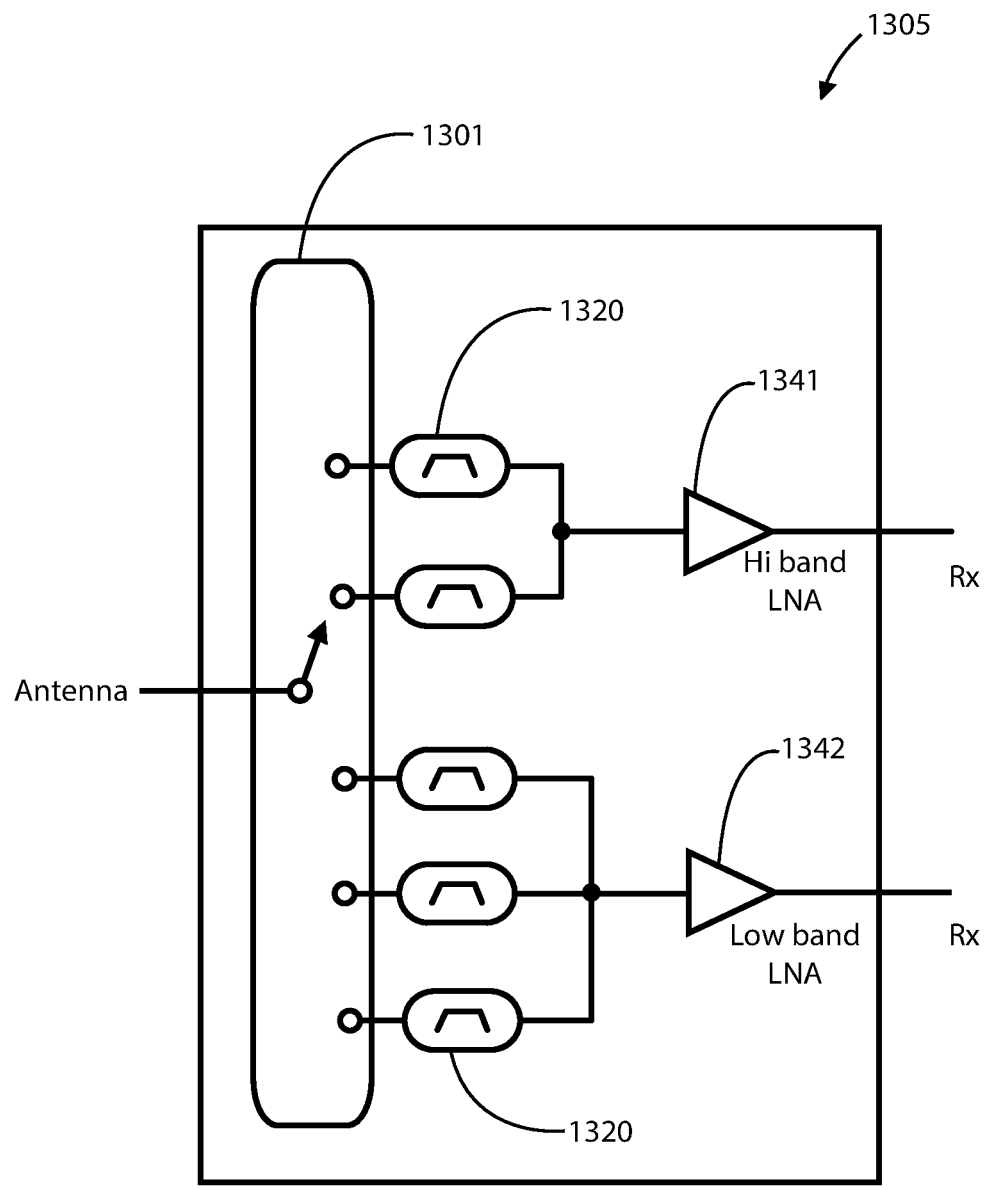

FIGS. 13A through 13E are simplified circuit diagrams illustrating various monolithic single chip single crystal devices according various examples of the present invention. FIG. 13A shows an antenna switch module 1301, which monolithically integrates a series of switches 1310. FIG. 13B shows a PA duplexer (PAD) 1302, which monolithically integrates a filter 1320 and a PA 1330. FIG. 13C shows a switched duplexer bank 1303, which monolithically integrates an antenna switch module 1301, filters 1320, a transmit switch module 1311, and a receive switch module 1312. FIG. 13D shows a transmit module 1304, which monolithically integrates an antenna switch module 1301, filters 1320, and PAs 1330. FIG. 13E shows a receive diversity module 1305, which monolithically integrates filters 1320, an antenna switch module 1301, a high band LNA 1341 and a low band LNA 1342. These are merely examples, and those of ordinary skill in the art will recognize other variations, modifications, and alternatives.

Figure 14:
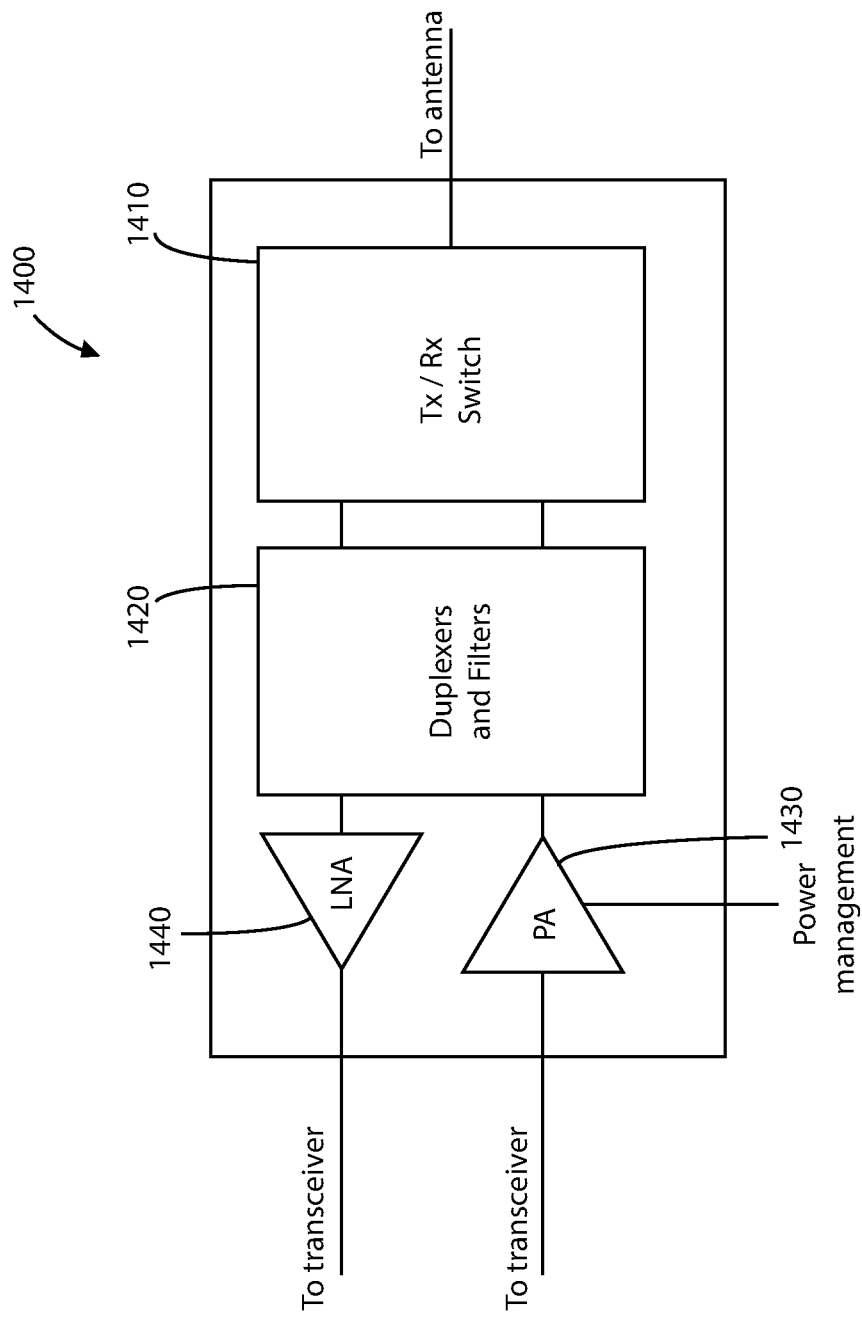
FIG. 14 is a simplified circuit diagram illustrating a monolithic single chip single crystal device integrated multiple circuit functions according an examples of the present invention.

FIG. 14 shows a monolithically integrated system 1400 with an LNA 1440 and a PA 1430 coupled to duplexers and filters 1420, which are coupled to transmit and receive switches 1410. These integrated components can include those that were described in FIGS. 13A-13E. Of course, there can be other variations, modifications, and alternatives.

Figure 15A:
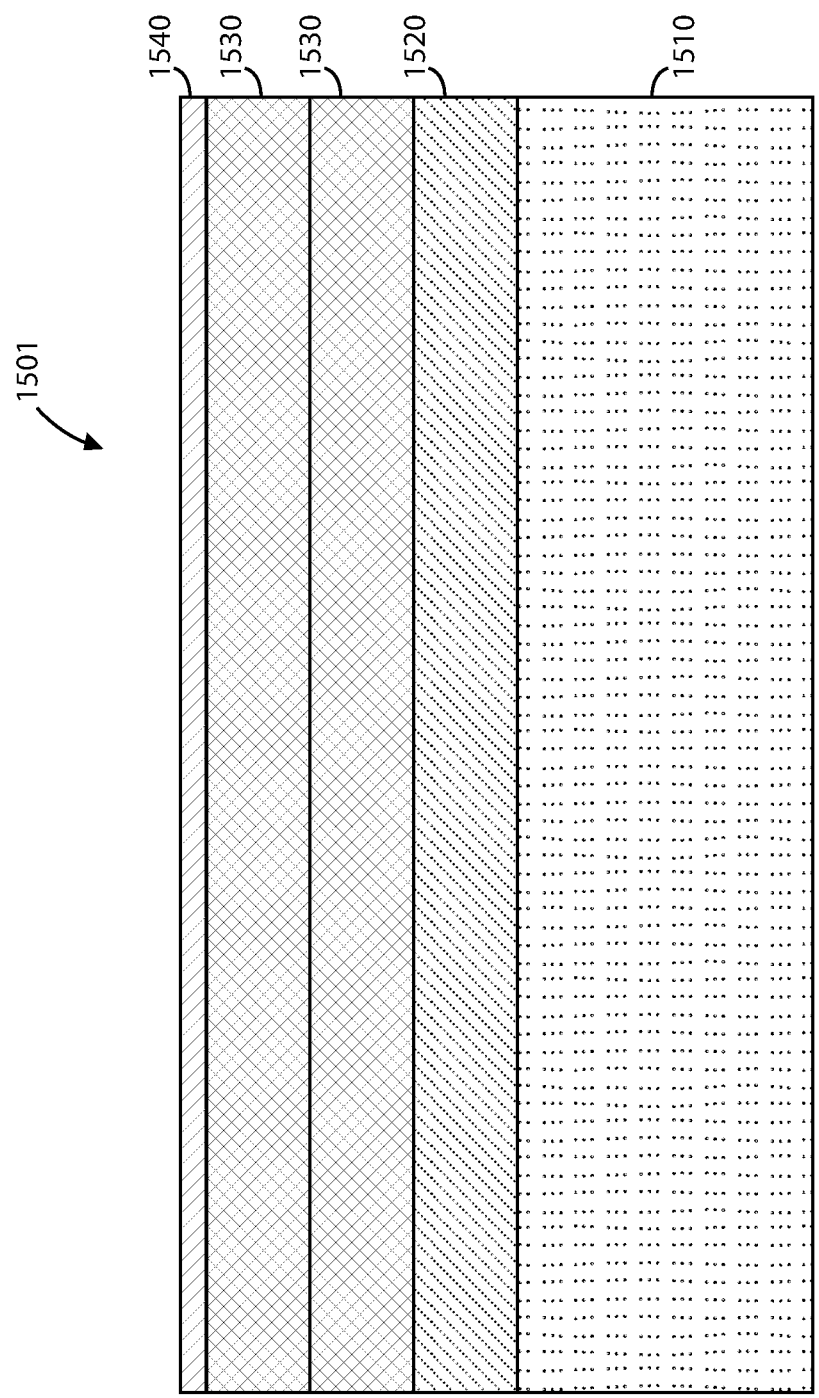
FIGS. 15A-15E are simplified diagrams illustrating cross-sectional views of monolithic single chip single crystal devices according to various example of the present invention.

FIGS. 15A-15E are a simplified diagrams illustrating cross-sectional views of monolithic single chip single crystal devices according to various examples of the present invention. In FIG. 15A, a substrate 1510 is provided as a foundation for an epitaxial film stack. The substrate can include silicon, silicon carbide, or other like materials. As shown in device 1501, a first epitaxial layer 1520 can be formed overlying the substrate. In a specific example, this first epitaxial layer can include single crystal aluminum nitride (AlN) materials and can have a thickness ranging from about 0.01 um to about 10.0 um. This epitaxial film can be grown using processes described previously and can be configured for switch/amplifier/filter device applications.

One or more second epitaxial layers 1530 can be formed overlying the first epitaxial layer. In an example, these second epitaxial layers can include single crystal aluminum gallium nitride ($Al_xGa_{1-x}N$) materials and can be configured for switch/amplifier/filter applications or other passive or active components. In a specific example, at least one of the second layers can be characterized by a composition of $0 \leq X < 1.0$ and can have a thickness ranging from about 200 nm to about 1200 nm. In another specific example, at least one of the second layers can be characterized by a composition of $0.10 \leq X < 1.0$ and can have a thickness ranging from about 10 nm to about 40 nm. The one or more second epitaxial layers can also be grown using the previously described processes. Also, the monolithic device 1400 can include a cap layer 1540, which can include gallium nitride (GaN) materials or the like. The cap layer can have a thickness ranging from about 0.10 nm to about 5.0 nm and can be used to prevent oxidation of the one or more second epitaxial layers.

Figure 15B:
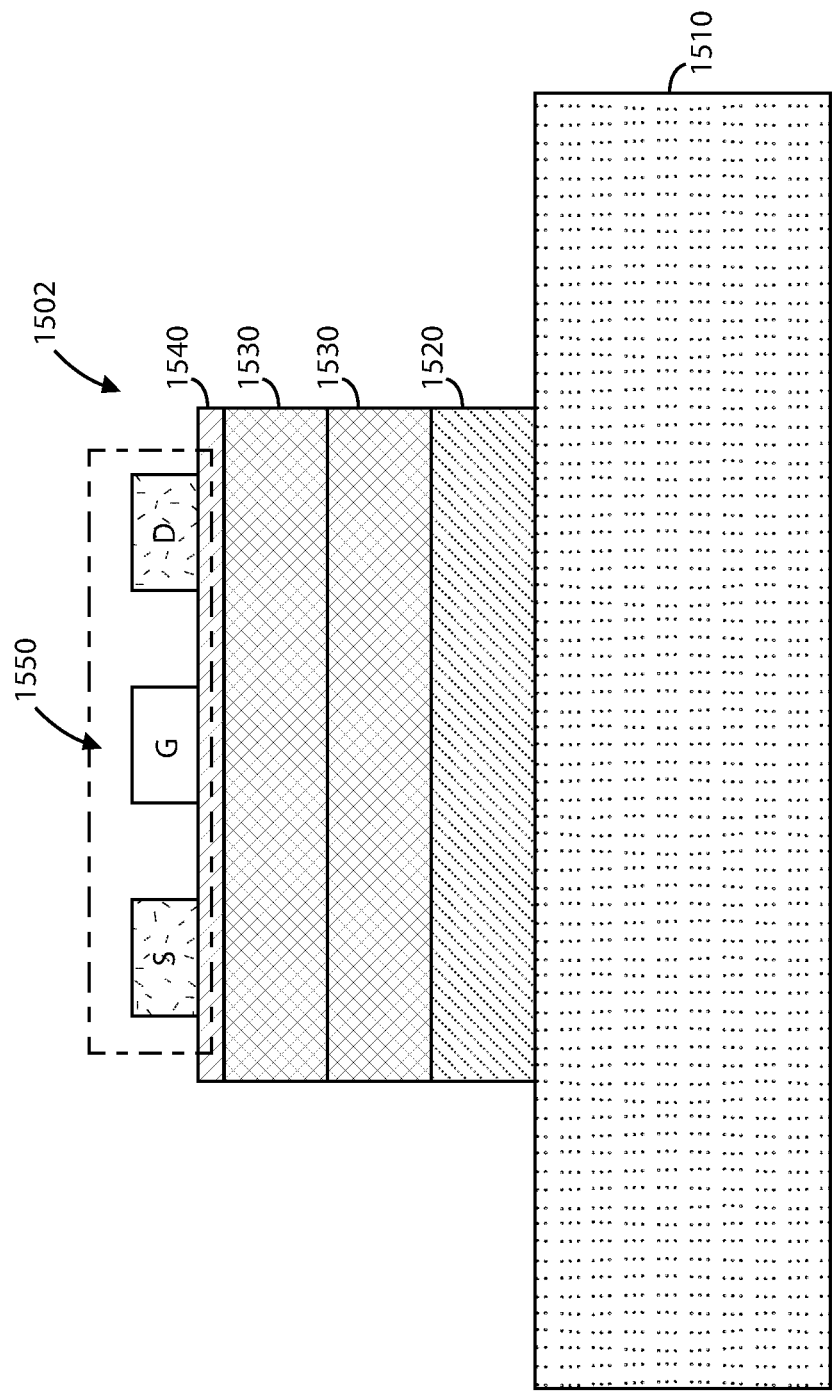

FIG. 15B shows a cross-sectional view of an example of a single crystal device with an active device having non-recessed contacts. As shown in device 1502, an active device 1550 is formed overlying the cap layer 1540. If there was no cap layer, then the active device would be formed overlying the top layer of the one or more second single crystal epitaxial layers 1530. This active device can be a PA, an LNA, or a switch, or any other active device component.

Figure 15C:
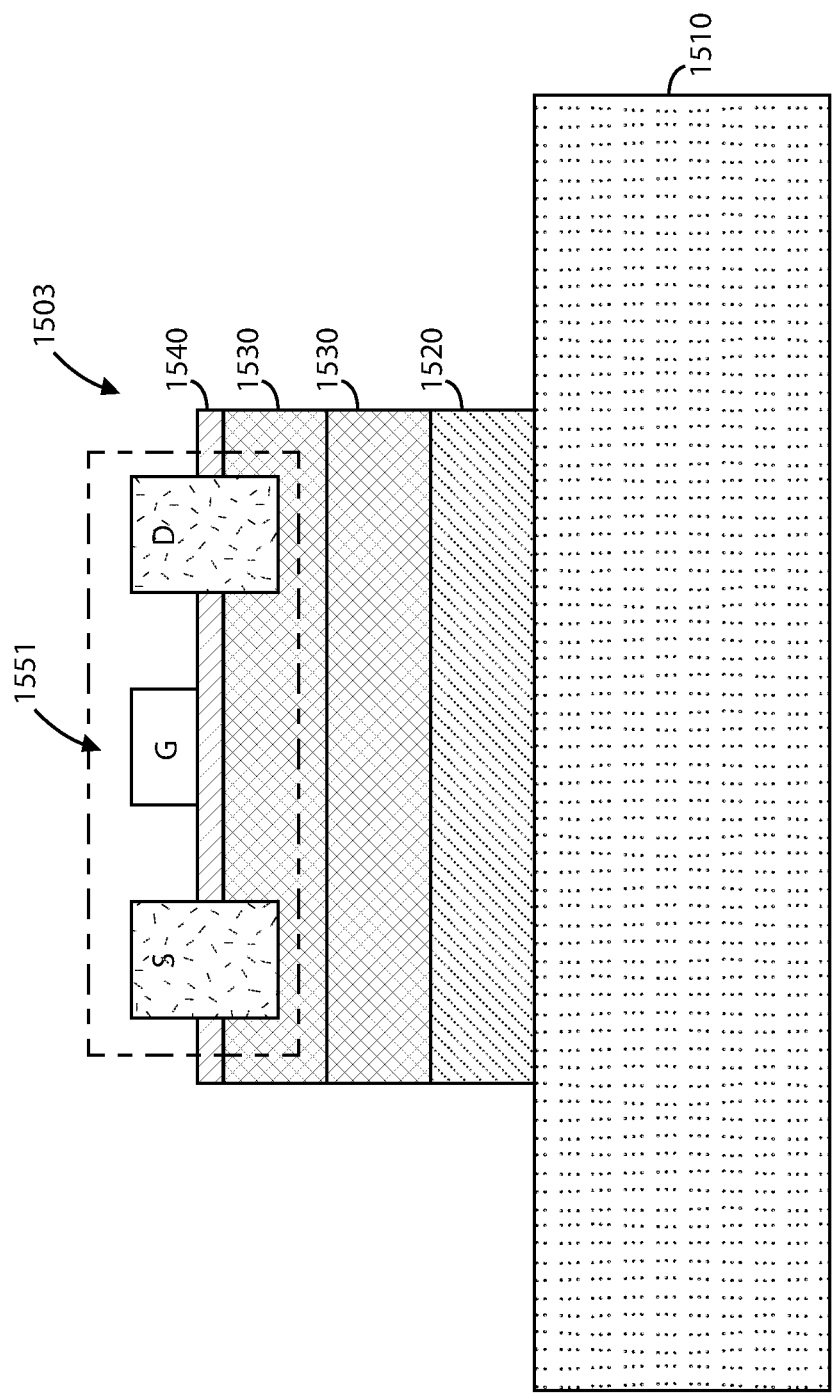

FIG. 15C shows a cross-sectional view of an example of a single crystal device with an active device having recessed contacts. As shown in device 1503, an active device 1551 is formed overlying the cap layer 1540. Here, the contacts of elements "S" and "D" extend past the cap layer and into the one or more second single crystal epitaxial layers 1530. As stated previously, this active device can be a PA, an LNA, or a switch, or any other active device component.

Figure 15D:
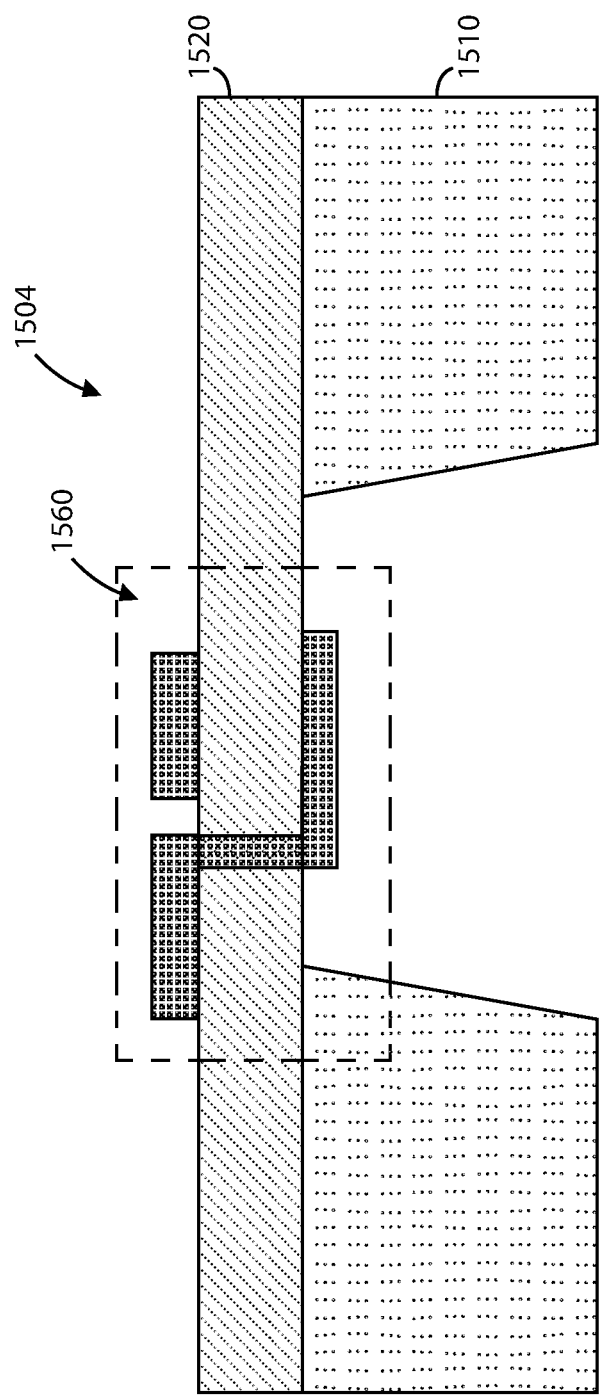

FIG. 15D shows a cross-sectional view of an example of a single crystal device with a passive filter device. As shown in device 1504, a filter device 1560 is formed through the first single crystal epitaxial layer 1520 with an underlying cavity in the substrate 1510. Other passive elements may also be implemented here.

Figure 15E:
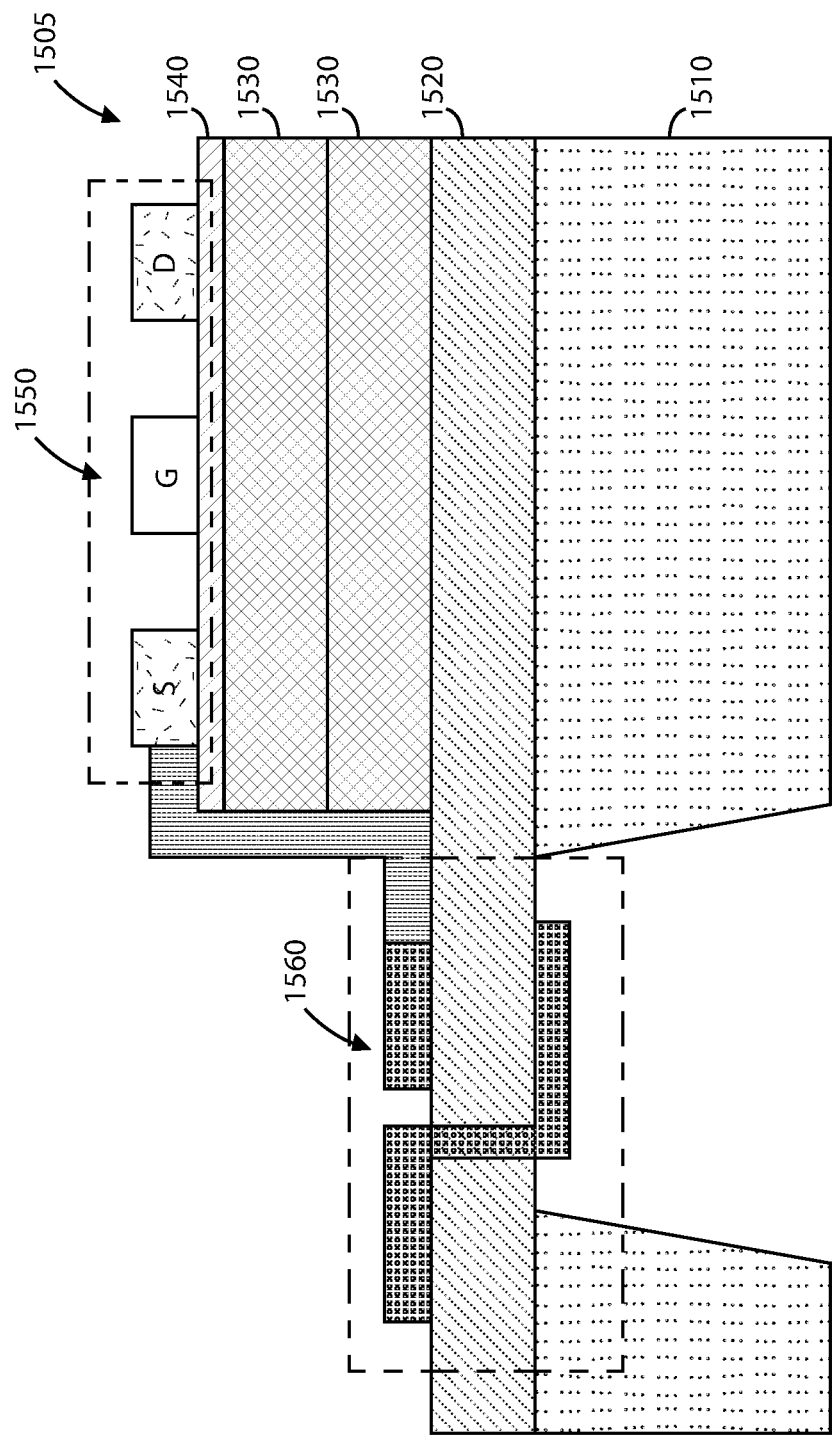

FIG. 15E shows a cross-sectional view of an example of a monolithic single chip single crystal device having a passive filter device and an active device having non-recessed contacts. As shown, device 1505 monolithically integrates the devices of FIGS. 15B and 15D, with the active device element 1550 and the filter device 1560. Of course, there can be other variations, modifications, and alternatives.

In an example, the monolithically integrated components described in FIGS. 13A-E and FIG. 14 can be implemented in an epitaxial stack structure as shown in FIGS. 15A-E. Compared to conventional embodiments, which combine various discretely packaged components onto a larger packaged device, the present invention provides a method to grow multiple single crystal device layers to monolithically integrate unpackaged active and passive single crystal components into a single chip package. This method is possible due to the use of single crystal bulk fabrication processes, such as those described previously. Using such a method, the resulting device can benefit from size reduction, improved performance, lower integrated cost, and a faster time to market.

One or more benefits are achieved over pre-existing techniques using the invention. In particular, the present device can be manufactured with lower integrated cost by using a smaller PCB area and fewer passive components. The monolithic single chip design of the present invention reduces the complexity of the front end module by eliminating wire bonds and discrete component packaging. Device performance can also be improved due to optimal impedance match, lower signal loss, and less assembly variability. Depending upon the embodiment, one or more of these benefits may be achieved. Of course, there can be other variations, modifications, and alternatives.

According to an example, the present invention provides a method of manufacturing a monolithic single chip single crystal device. The method can include providing a substrate having a substrate surface region; forming a first single crystal epitaxial layer overlying the substrate surface region; processing the first single crystal epitaxial layer to form one or more active or passive device components; forming one or more second single crystal epitaxial layers overlying the first single crystal epitaxial layer; and processing the one or more second single crystal epitaxial layers to form one or more active or passive device components. The first single crystal epitaxial layer and the one or more second single crystal epitaxial layers can form a monolithic epitaxial stack integrating multiple circuit functions.

The substrate can be selected from one of the following: a silicon substrate, a sapphire substrate, silicon carbide substrate, a GaN bulk substrate, a GaN template, an AlN bulk, an AlN template, and an $Al_xGa_{1-x}N$ template. In a specific example, the first single crystal epitaxial layer comprises an aluminum nitride (AlN) material used for the RF filter functionality, and wherein the first single crystal epitaxial layer is characterized by a thickness of about 0.01 um to about 10.0 um. In a specific example, at least one of the one or more second single crystal epitaxial layer comprises a single crystal aluminum gallium nitride ($Al_xGa_{1-x}N$) material, and wherein the second single crystal epitaxial layer is characterized by a composition of $0 \leq X < 1.0$ and a thickness of about 200 nm to about 1200 nm or a thickness of about 10 nm to about 40 nm. The one or more active or passive device components can include one or more filters, amplifiers, switches, or the like.

In an example, the method can further include forming a cap layer overlying the third epitaxial layer, wherein the cap layer comprises gallium nitride (GaN) materials. In a specific example, the cap layer is characterized by a thickness of about 0.10 nm to about 5.0 nm.

According to an example, the present invention also provides the resulting structure of the monolithic single chip single crystal device. The device includes a substrate having a substrate surface region; a first single crystal epitaxial layer formed overlying the substrate surface region, the first single crystal epitaxial layer having one or more active or passive device components; and one or more second single crystal epitaxial layers formed overlying the first single crystal epitaxial layer, the one or more second single crystal epitaxial layers having one or more active or passive device components. The first single crystal epitaxial layer and the one or more second single crystal epitaxial layers are formed as a monolithic epitaxial stack integrating multiple circuit functions.

Figure 16:
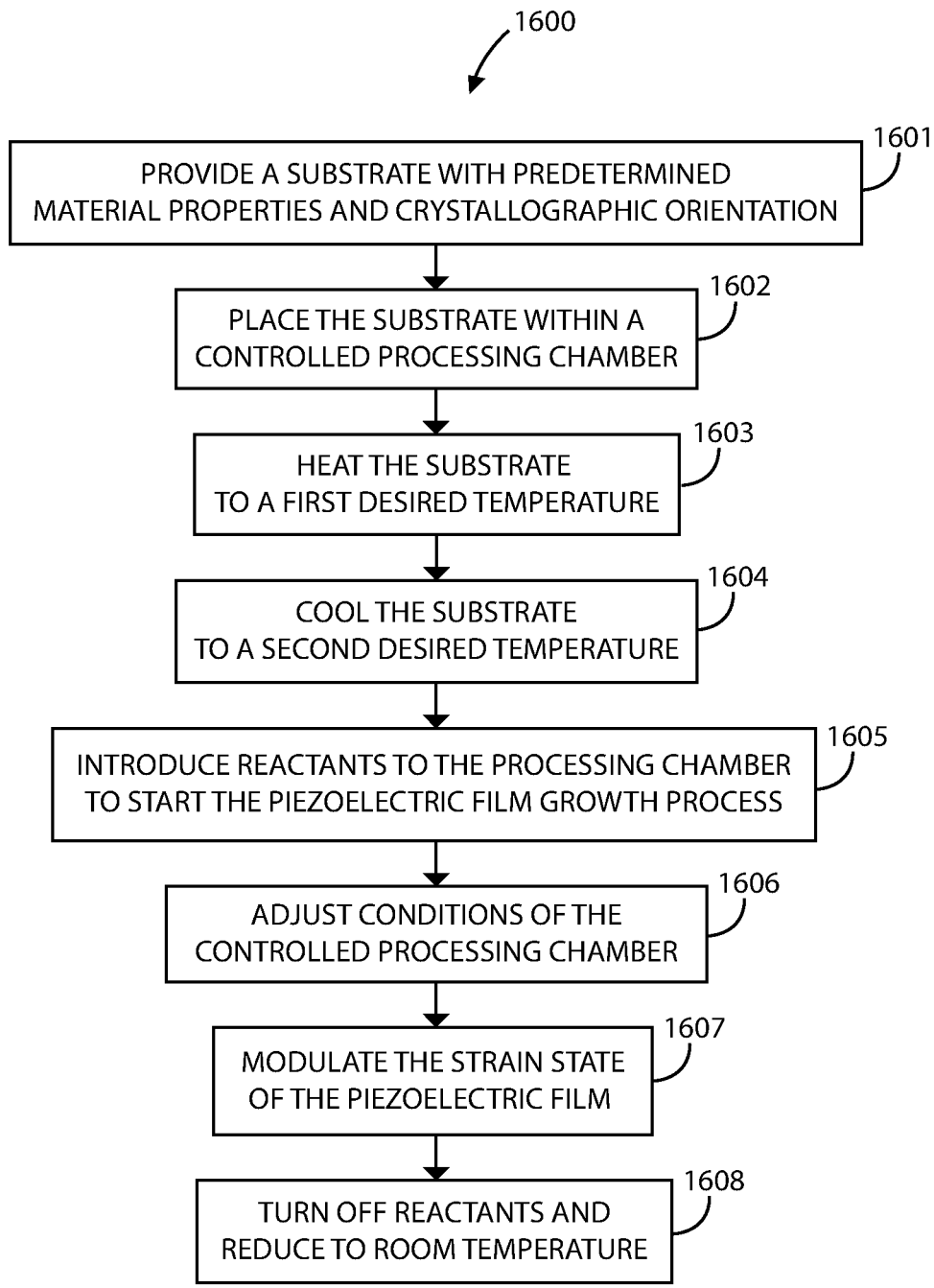
FIG. 16 is a simplified flow diagram illustrating a method for manufacturing an acoustic resonator device according to an example of the present invention.

FIG. 16 is a flow diagram illustrating a method for manufacturing an acoustic resonator device according to an example of the present invention. The following steps are merely examples and should not unduly limit the scope of the claims herein. One of ordinary skill in the art would recognize many other variations, modifications, and alternatives. For example, various steps outlined below may be added, removed, modified, rearranged, repeated, and/or overlapped, as contemplated within the scope of the invention. A typical growth process 1600 can be outlined as follows:

1601. Provide a substrate having the required material properties and crystallographic orientation. Various substrates can be used in the present method for fabricating an acoustic resonator device such as Silicon, Sapphire, Silicon Carbide, Gallium Nitride (GaN) or Aluminum Nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Those of ordinary skill in the art will recognize other variations, modifications, and alternatives;

1602. Place the selected substrate into a processing chamber within a controlled environment;

1603. Heat the substrate to a first desired temperature. At a reduced pressure between 5-800 mbar the substrates are heated to a temperature in the range of 1100°-1350° C. in the presence of purified hydrogen gas as a means to clean the exposed surface of the substrate. The purified hydrogen flow shall be in the range of 5-30 slpm (standard liter per minute) and the purity of the gas should exceed 99.9995%;

1604. Cool the substrate to a second desired temperature. After 10-15 minutes at elevated temperature, the substrate surface temperature should be reduced by 100-200° C.; the temperature offset here is determined by the selection of substrate material and the initial layer to be grown (Highlighted in FIGS. 18A-C);

1605. Introduce reactants to the processing chamber. After the temperature has stabilized the Group III and Group V reactants are introduced to the processing chamber and growth is initiated.

1606. Upon completion of the nucleation layer the growth chamber pressures, temperatures, and gas phase mixtures may be further adjusted to grow the layer or plurality of layers of interest for the acoustic resonator device.

1607. During the film growth process the strain-state of the material may be modulated via the modification of growth conditions or by the controlled introduction of impurities into the film (as opposed to the modification of the electrical properties of the film).

1608. At the conclusion of the growth process the Group III reactants are turned off and the temperature resulting film or films are controllably lowered to room. The rate of thermal change is dependent upon the layer or plurality of layers grown and in the preferred embodiment is balanced such that the physical parameters of the substrate including films are suitable for subsequent processing.

Referring to step 1605, the growth of the single crystal material can be initiated on a substrate through one of several growth methods: direct growth upon a nucleation layer, growth upon a super lattice nucleation layer, and growth upon a graded transition nucleation layer. The growth of the single crystal material can be homoepitaxial, heteroepitaxial, or the like. In the homoepitaxial method, there is a minimal lattice mismatch between the substrate and the films such as the case for a native III-N single crystal substrate material. In the heteroepitaxial method, there is a variable lattice mismatch between substrate and film based on in-plane lattice parameters. As further described below, the combinations of layers in the nucleation layer can be used to engineer strain in the subsequently formed structure.

Referring to step 1606, various substrates can be used in the present method for fabricating an acoustic resonator device. Silicon substrates of various crystallographic orientations may be used. Additionally, the present method can use sapphire substrates, silicon carbide substrates, gallium nitride (GaN) bulk substrates, or aluminum nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Those of ordinary skill in the art will recognize other variations, modifications, and alternatives.

In an example, the present method involves controlling material characteristics of the nucleation and piezoelectric layer(s). In a specific example, these layers can include single crystal materials that are configured with defect densities of less than 1E+11 defects per square centimeter. The single crystal materials can include alloys selected from at least one of the following: AlN, AlGaN, ScAlN, ScGaN, GaN, InN, InGaN, AlInN, AlInGaN, and BN. In various examples, any single or combination of the aforementioned materials can be used for the nucleation layer(s) and/or the piezoelectric layer(s) of the device structure.

According to an example, the present method involves strain engineering via growth parameter modification. More specifically, the method involves changing the piezoelectric properties of the epitaxial films in the piezoelectric layer via modification of the film growth conditions (these modifications can be measured and compared via the sound velocity of the piezoelectric films). These growth conditions can include nucleation conditions and piezoelectric layer conditions. The nucleation conditions can include temperature, thickness, growth rate, gas phase ratio (V/III), and the like. The piezo electric layer conditions can include transition conditions from the nucleation layer, growth temperature, layer thickness, growth rate, gas phase ratio (V/III), post growth annealing, and the like. Further details of the present method can be found below.

Figure 17:
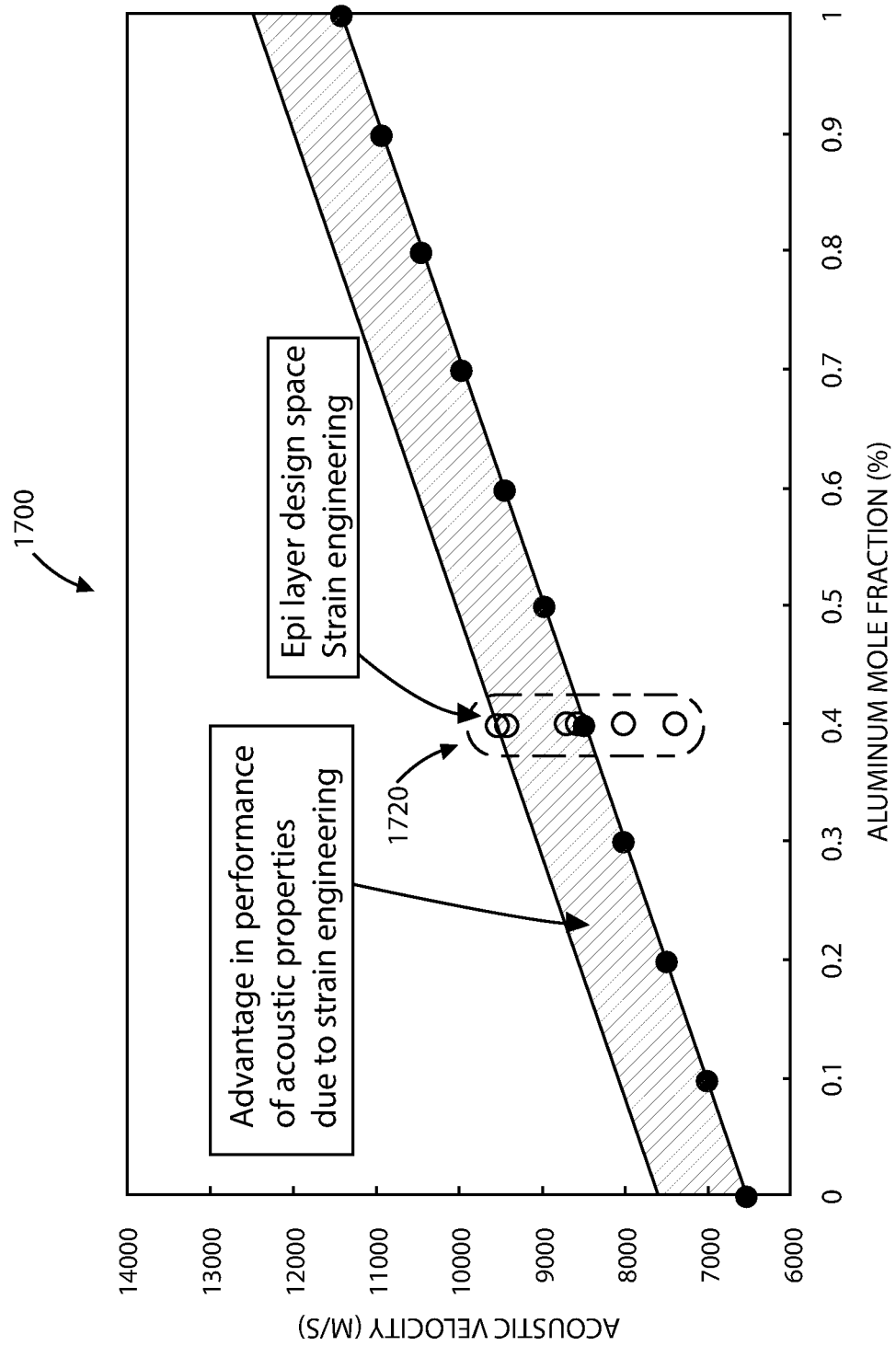
FIG. 17 is a simplified graph illustrating the results of forming a piezoelectric layer for an acoustic resonator device according to an example of the present invention. The graph highlights the ability of to tailor the acoustic properties of the material for a given Aluminum mole fraction. Such flexibility allows for the resulting resonator properties to be tailored to the individual application.

FIG. 17 is a simplified graph illustrating the results of forming a piezoelectric layer for an acoustic resonator device according to an example of the present invention. This graph highlights the ability of to tailor the acoustic properties of the material for a given Aluminum mole fraction. Referring to step 1607 above, such flexibility allows for the resulting resonator properties to be tailored to the individual application. As shown, graph 1700 depicts a plot of acoustic velocity (m/s) over aluminum mole fraction (%). The marked region 1720 shows the modulation of acoustic velocity via strain engineering of the piezo electric layer at an aluminum mole fraction of 0.4. Here, the data shows that the change in acoustic velocity ranges from about 7,500 m/s to about 9,500 m/s, which is about ±1,000 m/s around the initial acoustic velocity of 8,500 m/s. Thus, the modification of the growth parameters provides a large tunable range for acoustic velocity of the acoustic resonator device. This tunable range will be present for all aluminum mole fractions from 0 to 1.0 and is a degree of freedom not present in other conventional embodiments of this technology.

The present method also includes strain engineering by impurity introduction, or doping, to impact the rate at which a sound wave will propagate through the material. Referring to step 1607 above, impurities can be specifically introduced to enhance the rate at which a sound wave will propagate through the material. In an example, the impurity species can include, but is not limited to, the following: silicon (Si), magnesium (Mg), carbon (C), oxygen (0), erbium (Er), rubidium (Rb), strontium (Sr), scandium (Sc), beryllium (Be), molybdenum (Mo), zirconium (Zr), Hafnium (Hf), and vanadium (Va). Silicon, magnesium, carbon, and oxygen are common impurities used in the growth process, the concentrations of which can be varied for different piezoelectric properties. In a specific example, the impurity concentration ranges from about 1E+10 to about 1E+21 per cubic centimeter. The impurity source used to deliver the impurities to can be a source gas, which can be delivered directly, after being derived from an organometallic source, or through other like processes.

The present method also includes strain engineering by the introduction of alloying elements, to impact the rate at which a sound wave will propagate through the material. Referring to step 1607 above, alloying elements can be specifically introduced to enhance the rate at which a sound wave will propagate through the material. In an example, the alloying elements can include, but are not limited to, the following: magnesium (Mg), erbium (Er), rubidium (Rb), strontium (Sr), scandium (Sc), titanium (Ti), zirconium (Zr), Hafnium (Hf), vanadium (Va), Niobium (Nb), and tantalum (Ta). In a specific embodiment, the alloying element (ternary alloys) or elements (in the case of quaternary alloys) concentration ranges from about 0.01% to about 50%. Similar to the above, the alloy source used to deliver the alloying elements can be a source gas, which can be delivered directly, after being derived from an organometallic source, or through other like processes. Those of ordinary skill in the art will recognize other variations, modifications, and alternatives to these processes.

The methods for introducing impurities can be during film growth (in-situ) or post growth (ex-situ). During film growth, the methods for impurity introduction can include bulk doping, delta doping, co-doping, and the like. For bulk doping, a flow process can be used to create a uniform dopant incorporation. For delta doping, flow processes can be intentionally manipulated for localized areas of higher dopant incorporation. For co-doping, the any doping methods can be used to simultaneously introduce more than one dopant species during the film growth process. Following film growth, the methods for impurity introduction can include ion implantation, chemical treatment, surface modification, diffusion, co-doping, or the like. The of ordinary skill in the art will recognize other variations, modifications, and alternatives.

Figure 18A:
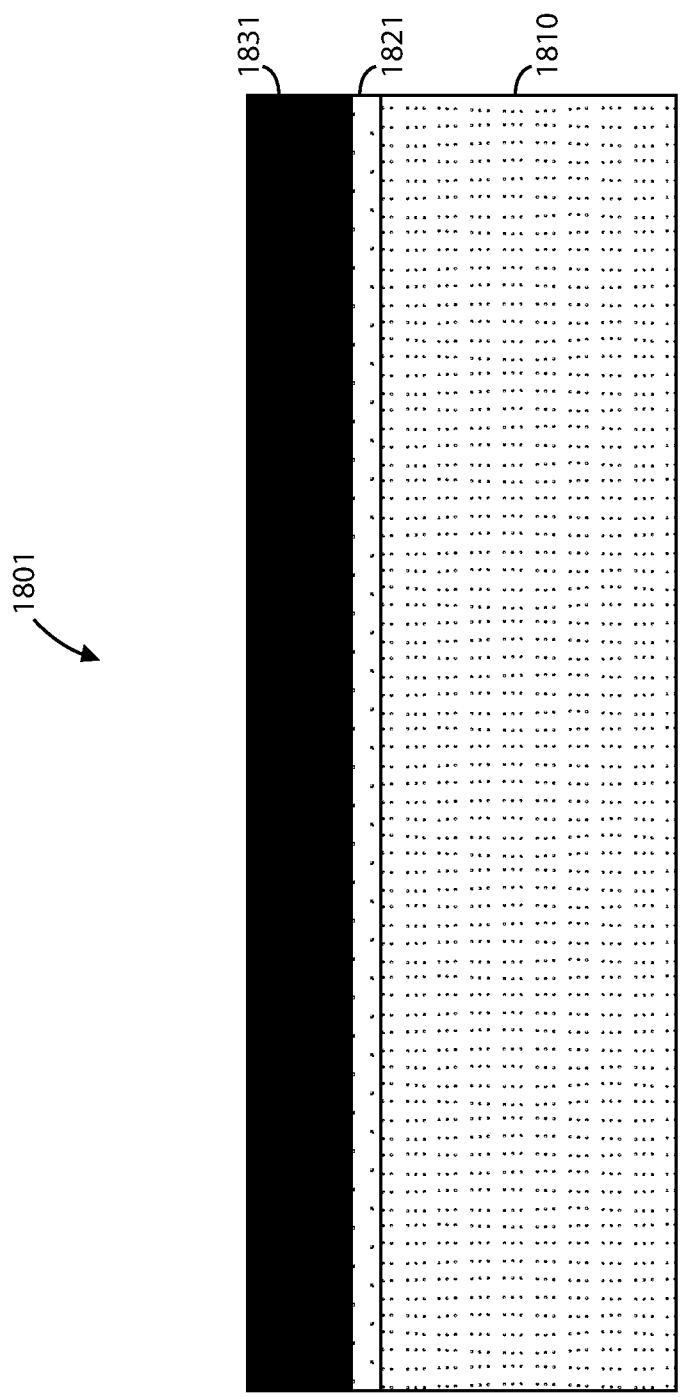
FIG. 18A is a simplified diagram illustrating a method for forming a piezoelectric layer for an acoustic resonator device according to an example of the present invention.

FIG. 18A is a simplified diagram illustrating a method for forming a piezoelectric layer for an acoustic resonator device according to an example of the present invention. As shown in device 1801, the piezoelectric layer 1831, or film, is directly grown on the nucleation layer 1821, which is formed overlying a surface region of a substrate 1810. The nucleation layer 1821 may be the same or different atomic composition as the piezoelectric layer 1831. Here, the piezoelectric film 1831 may be doped by one or more species during the growth (in-situ) or post-growth (ex-situ) as described previously.

Figure 18B:
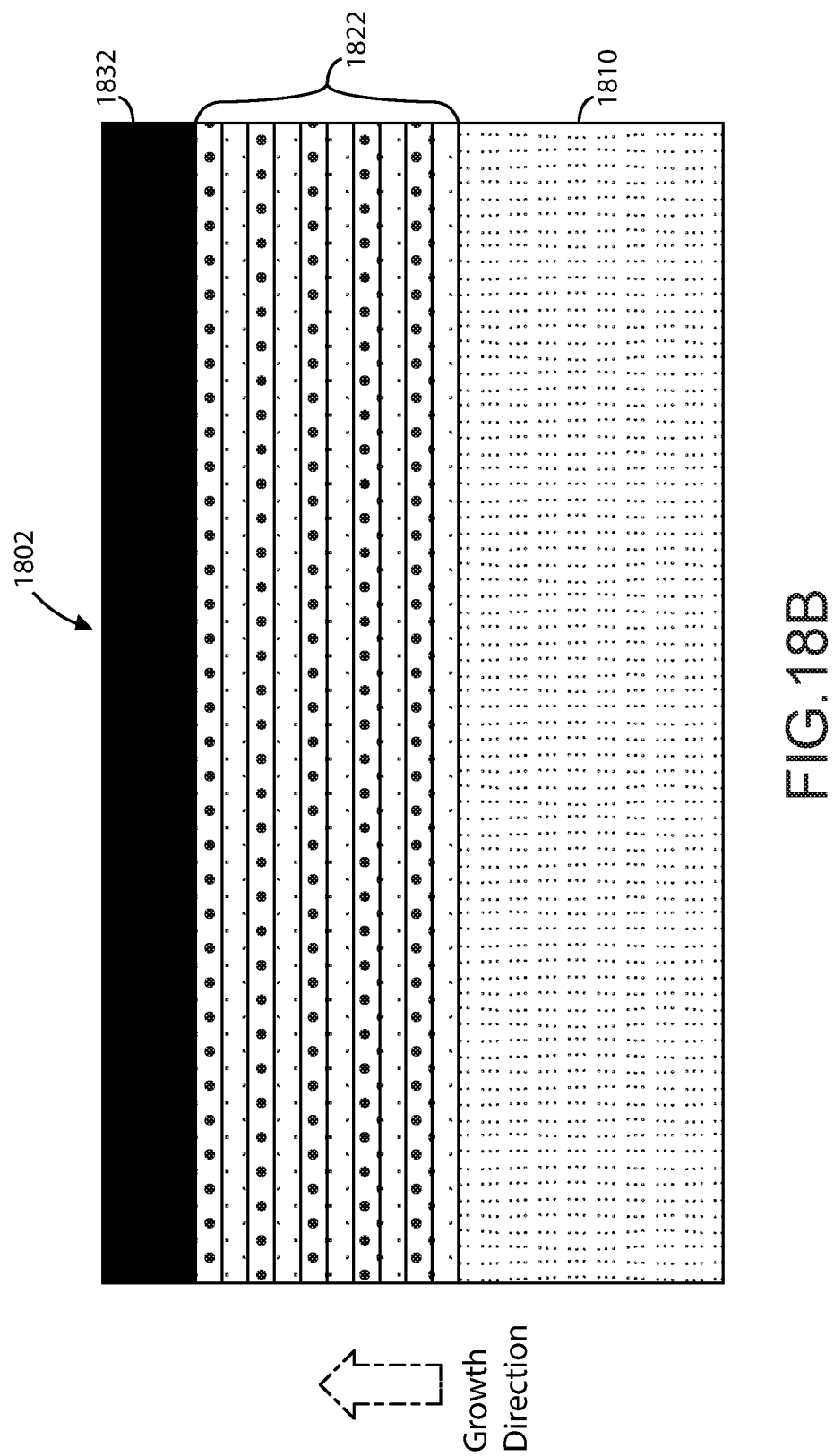
FIG. 18B is a simplified diagram illustrating a method for forming a piezoelectric layer for an acoustic resonator device according to an example of the present invention.

FIG. 18B is a simplified diagram illustrating a method for forming a piezoelectric layer for an acoustic resonator device according to an example of the present invention. As shown in device 1802, the piezoelectric layer 1832, or film, is grown on a super lattice nucleation layer 1822, which is comprised of layer with alternating composition and thickness. This super lattice layer 1822 is formed overlying a surface region of the substrate 1810. The strain of device 1802 can be tailored by the number of periods, or alternating pairs, in the super lattice layer 1822 or by changing the atomic composition of the constituent layers. Similarly, the piezoelectric film 1832 may be doped by one or more species during the growth (in-situ) or post-growth (ex-situ) as described previously.

FIG. 18C is a simplified diagram illustrating a method for forming a piezoelectric layer for an acoustic resonator device according to an example of the present invention. As shown in device 1803, the piezoelectric layer 1833, or film, is grown on graded transition layers 1823. These transition layers 1823, which are formed overlying a surface region of the substrate 1810, can be used to tailor the strain of device 1803. In an example, the alloy (binary or ternary) content can be decreased as a function of growth in the growth direction. This function may be linear, step-wise, or continuous. Similarly, the piezoelectric film 1833 may be doped by one or more species during the growth (in-situ) or post-growth (ex-situ) as described previously.

In an example, the present invention provides a method for manufacturing an acoustic resonator device. As described previously, the method can include a piezoelectric film growth process such as a direct growth upon a nucleation layer, growth upon a super lattice nucleation layer, or a growth upon graded transition nucleation layers. Each process can use nucleation layers that include, but are not limited to, materials or alloys having at least one of the following: AlN, AlGaN, GaN, InN, InGaN, AlInN, AlInGaN, and BN. Those of ordinary skill in the art will recognize other variations, modifications, and alternatives.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic resonator using multiple ways of three-dimensional stacking through a wafer level process. Such filters or resonators can be implemented in an RF filter device, an RF filter system, or the like. Depending upon the embodiment, one or more of these benefits may be achieved. Of course, there can be other variations, modifications, and alternatives.

As an example, the packaged device can include any combination of elements described above, as well as outside of the present specification. As used herein, the term "substrate" can mean the bulk substrate or can include overlying growth structures such as an aluminum, gallium, or ternary compound of aluminum and gallium and nitrogen containing epitaxial region, or functional regions, combinations, and the like.

Figure 19:
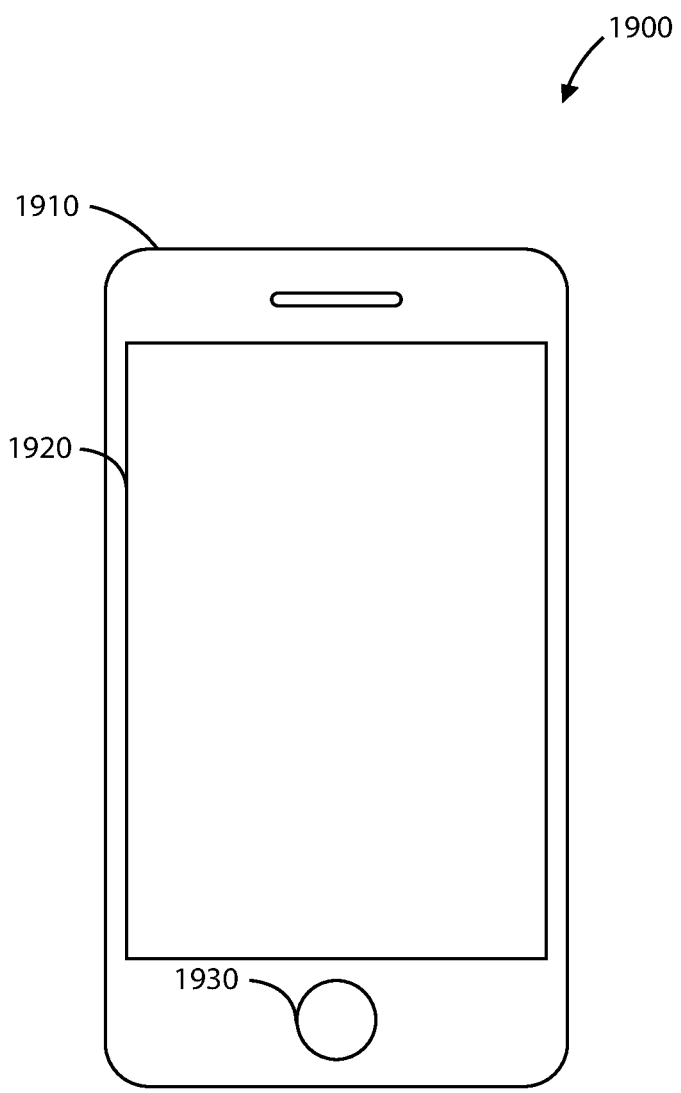
FIG. 19 is a simplified illustrating a smart phone according to an example of the present invention.

FIG. 19 is a simplified diagram 1900 illustrating a smart phone with a capture image of a user according to an embodiment of the present invention. As shown, the smart phone includes a housing 1910, display 1920, and interface device 1930, which may include a button, microphone, or touch screen. Preferably, the phone has a high-resolution camera device, which can be used in various modes. An example of a smart phone can be an iPhone from Apple Computer of Cupertino Calif. Alternatively, the smart phone can be a Galaxy from Samsung or others.

In an example, the smart phone includes the following features (which are found in an iPhone 4 from Apple Computer, although there can be variations), see www.apple.com.

GSM model: UMTS/HSDPA/HSUPA (850, 900, 1900, 2100 MHz); GSM/EDGE (850, 900, 1800, 1900 MHz)
CDMA model: CDMA EV-DO Rev. A (800, 1900 MHz)
802.11b/g/n Wi-Fi (802.11n 2.4 GHz only)
Bluetooth 2.1+EDR wireless technology
Assisted GPS
Digital compass
Wi-Fi
Cellular
Retina display
3.5-inch (diagonal) widescreen Multi-Touch display
800:1 contrast ratio (typical)
500 cd/m2 max brightness (typical)
Fingerprint-resistant oleophobic coating on front and back
Support for display of multiple languages and characters simultaneously
5-megapixel iSight camera
Video recording, HD (720p) up to 30 frames per second with audio
VGA-quality photos and video at up to 30 frames per second with the front camera
Tap to focus video or still images
LED flash
Photo and video geotagging
Built-in rechargeable lithium-ion battery
Charging via USB to computer system or power adapter
Talk time: Up to 7 hours on 3G, up to 14 hours on 2G (GSM)
Standby time: Up to 300 hours
Internet use: Up to 6 hours on 3G, up to 10 hours on Wi-Fi
Video playback: Up to 10 hours
Audio playback: Up to 40 hours
Frequency response: 20 Hz to 20,000 Hz
Audio formats supported: AAC (8 to 320 Kbps), Protected AAC (from iTunes Store), HE-AAC, MP3 (8 to 320 Kbps), MP3 VBR, Audible (formats 2, 3, 4, Audible Enhanced Audio, AAX, and AAX+), Apple Lossless, AIFF, and WAV
User-configurable maximum volume limit
Video out support at up to 720p with Apple Digital AV Adapter or Apple VGA Adapter; 576p and 480p with Apple Component AV Cable; 576i and 480i with Apple Composite AV Cable (cables sold separately)
Video formats supported: H.264 video up to 720p, 30 frames per second, Main Profile Level 3.1 with AAC-LC audio up to 160 Kbps, 48 kHz, stereo audio in .m4v, .mp4, and .mov file formats; MPEG-4 video up to 2.5 Mbps, 640 by 480 pixels, 30 frames per second, Simple Profile with AAC-LC audio up to 160 Kbps per channel, 48 kHz, stereo audio in .m4v, .mp4, and .mov file formats; Motion JPEG (M-JPEG) up to 35 Mbps, 1280 by 720 pixels, 30 frames per second, audio in ulaw, PCM stereo audio in .avi file format
Three-axis gyro
Accelerometer
Proximity sensor
Ambient light sensor."

An exemplary electronic device may be a portable electronic device, such as a media player, a cellular phone, a personal data organizer, or the like. Indeed, in such embodiments, a portable electronic device may include a combination of the functionalities of such devices. In addition, the electronic device may allow a user to connect to and communicate through the Internet or through other networks, such as local or wide area networks. For example, the portable electronic device may allow a user to access the internet and to communicate using e-mail, text messaging, instant messaging, or using other forms of electronic communication. By way of example, the electronic device may be a model of an iPod having a display screen or an iPhone available from Apple Inc.

In certain embodiments, the device may be powered by one or more rechargeable and/or replaceable batteries. Such embodiments may be highly portable, allowing a user to carry the electronic device while traveling, working, exercising, and so forth. In this manner, and depending on the functionalities provided by the electronic device, a user may listen to music, play games or video, record video or take pictures, place and receive telephone calls, communicate with others, control other devices (e.g., via remote control and/or Bluetooth functionality), and so forth while moving freely with the device. In addition, device may be sized such that it fits relatively easily into a pocket or a hand of the user. While certain embodiments of the present invention are described with respect to a portable electronic device, it should be noted that the presently disclosed techniques may be applicable to a wide array of other, less portable, electronic devices and systems that are configured to render graphical data, such as a desktop computer.

In the presently illustrated embodiment, the exemplary device includes an enclosure or housing 1910, a display, user input structures, and input/output connectors. The enclosure may be formed from plastic, metal, composite materials, or other suitable materials, or any combination thereof. The enclosure may protect the interior components of the electronic device from physical damage, and may also shield the interior components from electromagnetic interference (EMI).

The display 1920 may be a liquid crystal display (LCD), a light emitting diode (LED) based display, an organic light emitting diode (OLED) based display, or some other suitable display. In accordance with certain embodiments of the present invention, the display may display a user interface and various other images, such as logos, avatars, photos, album art, and the like. Additionally, in one embodiment, the display may include a touch screen through which a user may interact with the user interface. The display may also include various function and/or system indicators to provide feedback to a user, such as power status, call status, memory status, or the like. These indicators may be incorporated into the user interface displayed on the display.

In one embodiment, one or more of the user input structures 1930 are configured to control the device, such as by controlling a mode of operation, an output level, an output type, among others. For instance, the user input structures may include a button to turn the device on or off. Further the user input structures may allow a user to interact with the user interface on the display. Embodiments of the portable electronic device may include any number of user input structures, including buttons, switches, a control pad, a scroll wheel, or any other suitable input structures. The user input structures may work with the user interface displayed on the device to control functions of the device and/or any interfaces or devices connected to or used by the device. For example, the user input structures may allow a user to navigate a displayed user interface or to return such a displayed user interface to a default or home screen.

The exemplary device may also include various input and output ports to allow connection of additional devices. For example, a port may be a headphone jack that provides for the connection of headphones. Additionally, a port may have both input/output capabilities to provide for connection of a headset (e.g., a headphone and microphone combination). Embodiments of the present invention may include any number of input and/or output ports, such as headphone and headset jacks, universal serial bus (USB) ports, IEEE-1394 ports, and AC and/or DC power connectors. Further, the device may use the input and output ports to connect to and send or receive data with any other device, such as other portable electronic devices, personal computers, printers, or the like. For example, in one embodiment, the device may connect to a personal computer via an IEEE-1394 connection to send and receive data files, such as media files. Further details of the device can be found in U.S. Pat. No. 8,294,730, assigned to Apple, Inc.

Figure 20:
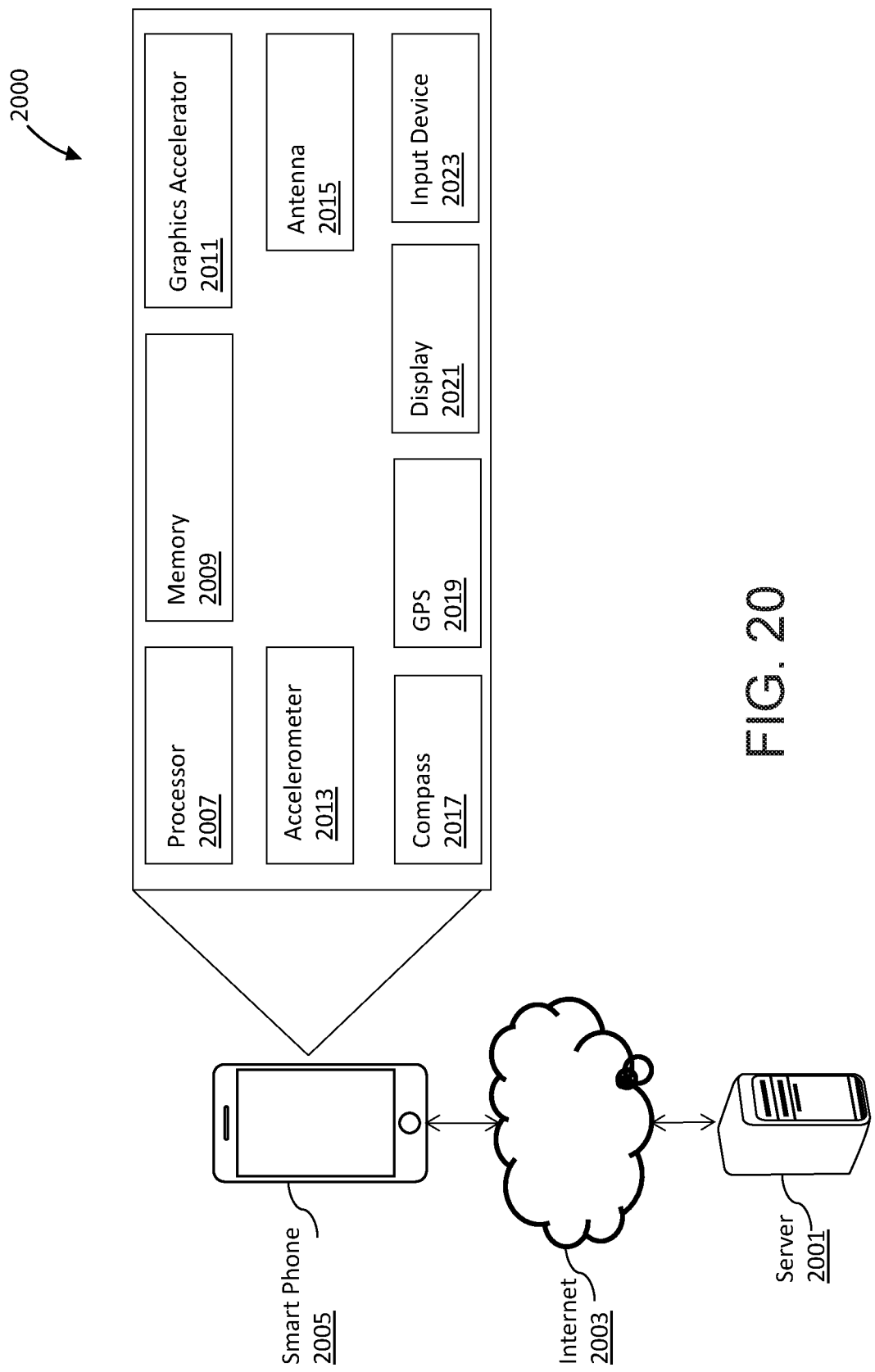
FIG. 20 is a simplified system diagram with a smart phone according to an example of the present invention.

FIG. 20 is a simplified system diagram 2000 with a smart phone according to an embodiment of the present invention. A server 2001 is in electronic communication with a handheld electronic device 2005 having functional components such as a processor 2007, memory 2009, graphics accelerator 2011, accelerometer 2013, communications interface 2015, compass 2017, GPS 2019, display 2021, and input device 2023. Each device is not limited to the illustrated components. The components may be hardware, software or a combination of both.

In some examples, instructions are input to the handheld electronic device 2005 through an input device 2023 that instructs the processor 2007 to execute functions in an electronic imaging application. One potential instruction can be to generate a wireframe of a captured image of a portion of a human user. In that case the processor 2007 instructs the communications interface 2015 to communicate with the server 2001, via the internet 2003 or the like, and transfer human wireframe or image data. The data transferred by the communications interface 2015 and either processed by the processor 2007 immediately after image capture or stored in memory 2009 for later use, or both. The processor 2007 also receives information regarding the display's 2021 attributes, and can calculate the orientation of the device, or e.g., using information from an accelerometer 2013 and/or other external data such as compass headings from a compass 2017, or GPS location from a GPS chip, and the processor then uses the information to determine an orientation in which to display the image depending upon the example.

In an example, the captured image can be drawn by the processor 2007, by a graphics accelerator 2011, or by a combination of the two. In some embodiments, the processor 2007 can be the graphics accelerator. The image can be first drawn in memory 2009 or, if available, memory directly associated with the graphics accelerator 2011. The methods described herein can be implemented by the processor 2007, the graphics accelerator 2011, or a combination of the two to create the image and related wireframe. Once the image or wireframe is drawn in memory, it can be displayed on the display 2021.

Figure 21:
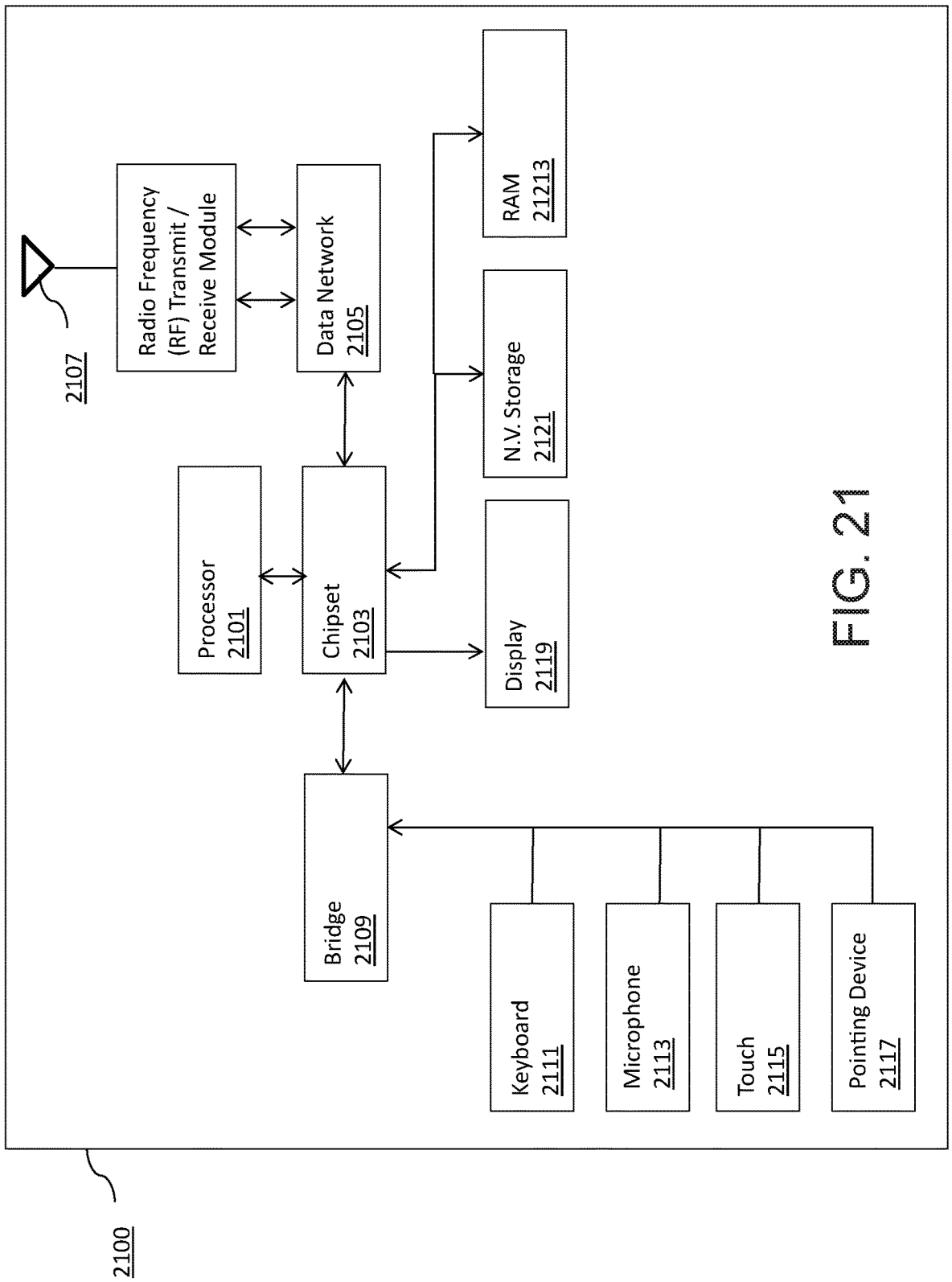
FIG. 21 is a simplified diagram of a smart phone system diagram according to an example of the present invention.

FIG. 21 is a simplified diagram of a smart phone system diagram according to an example of the present invention. System 2100 is an example of hardware, software, and firmware that can be used to implement disclosures above. System 2100 includes a processor 2101, which is representative of any number of physically and/or logically distinct resources capable of executing software, firmware, and hardware configured to perform identified computations. Processor 2101 communicates with a chipset 2103 that can control input to and output from processor 2101. In this example, chipset 2103 outputs information to display 2119 and can read and write information to non-volatile storage 2121, which can include magnetic media and solid state media, for example. Chipset 2103 also can read data from and write data to RAM 21213. A bridge 2109 for interfacing with a variety of user interface components can be provided for interfacing with chipset 2103. Such user interface components can include a keyboard 2111, a microphone 2113, touch-detection-and-processing circuitry 2115, a pointing device such as a mouse 2117, and so on. In general, inputs to system 2100 can come from any of a variety of sources, machine-generated and/or human-generated sources.

Chipset 2103 also can interface with one or more data network interfaces 2105 that can have different physical interfaces 2107. Such data network interfaces can include interfaces for wired and wireless local area networks, for broadband wireless networks, as well as personal area networks. Some applications of the methods for generating and displaying and using the GUI disclosed herein can include receiving data over physical interface 2107 or be generated by the machine itself by processor 2101 analyzing data stored in memory 2121 or 21213. Further, the machine can receive inputs from a user via devices keyboard 2111, microphone 2113, touch device 2114, and pointing device 2117 and execute appropriate functions, such as browsing functions by interpreting these inputs using processor 2101.

A transmit module and a receive module is coupled between the antenna and data network interfaces. In an example, the transmit module and the receive module can be separate devices, or integrated with each other in a single module. Of course, there can be alternatives, modifications, and variations. Further details of the module can be found throughout the present specification and more particularly below.

Figure 22:
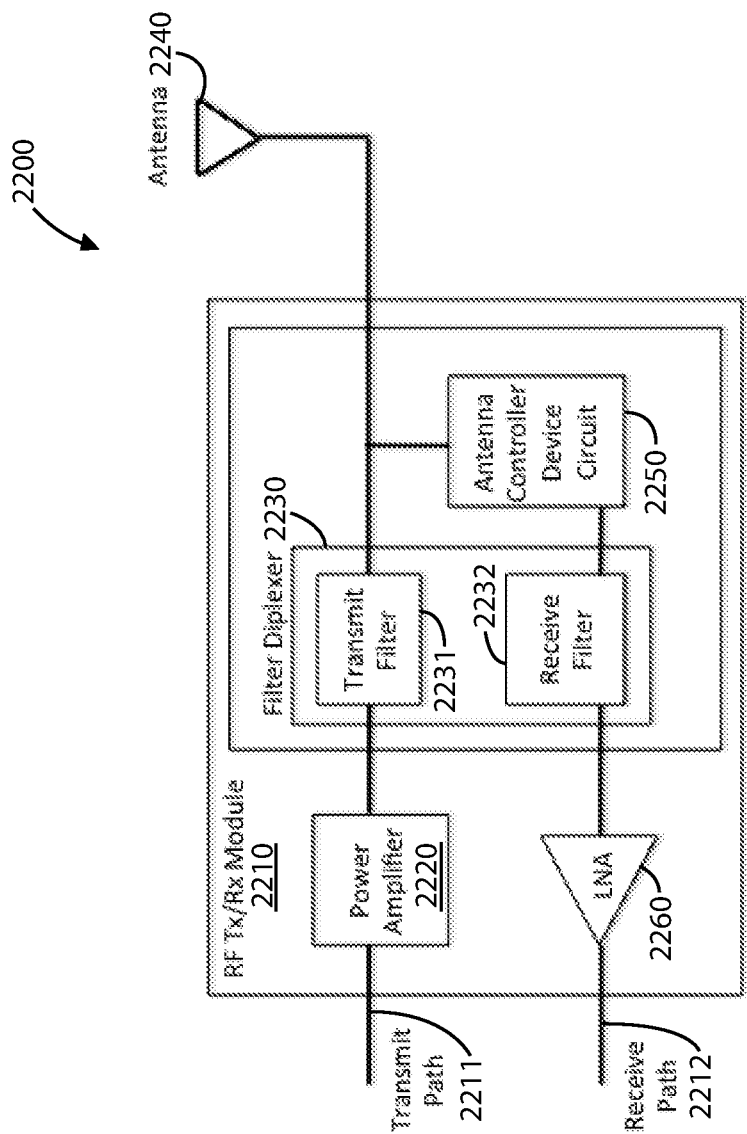
FIG. 22 is a simplified diagram of a transmit module and a receive module according to examples of the present invention.

FIG. 22 is a simplified diagram of device 2200 including a transmit module and a receive module 2210 according to examples of the present invention. In an example, the transmit module and the receive module are shown as one block structure. As shown, the RF transmit module is configured on a transmit path 2211. The RF receive module is configured on a receive path 2212. In an example, the antenna 2240 is coupled to the RF transmit module 2231 and the RF receive module 2232. As shown, an antenna control device 2250 is coupled to the receive path 2212 and the transmit path 2211, and is configured to select either the receive path 2212 or the transmit path 2211. In other examples, the antenna control can include a variety of features. Such features include signal tracking, filtering, and the like.

In an example, a receive filter 2232 provided within the RF receive module. In an example, a low noise amplifier device 2260 coupled to the RF receive module. The low noise amplifier can be of CMOS, GaAs, SiGe process technology, or the like. In an example, a transmit filter 2231 is provided within the RF transmit module. The transmit filter comprises a filter 2230 comprising a single crystal acoustic resonator device. As shown in FIG. 22, the filter 2230 includes both the transmit and receive filters 2231, 2232. In an example, a power amplifier 2220 is coupled to the RF transmit module, and configured to drive a signal through the transmit path 2211 to the antenna 2240. In an example, the power amplifier is CMOS, GaAs, SiGe process technology, or the like.

In an example, a band-to-band isolation is characterizing the transmit filter such that a difference between a pass band to reject band as measured in relative decibels (dBc) is greater than 10 dBc and less than 100 dBc. In other examples, the difference can have a broader or narrower range. In an example, an insertion loss characterizing the transmit filter, the insertion loss being less than 3 dB and greater than 0.5 dB. In other examples, a center frequency configured to define the pass band.

In an example, the single crystal acoustic resonator device is included. In an example, the device a substrate, which has a surface region. In an example, the resonator device has a first electrode material coupled to a portion of the substrate, and a single crystal capacitor dielectric material having a thickness of greater than 0.4 microns and overlying an exposed portion of the surface region and coupled to the first electrode material. In an example, the single crystal capacitor dielectric material is characterized by a dislocation density of less than $10^{12}$ defects/cm$^2$. In an example, the device has a second electrode material overlying the single crystal capacitor dielectric material.

Figure 23:
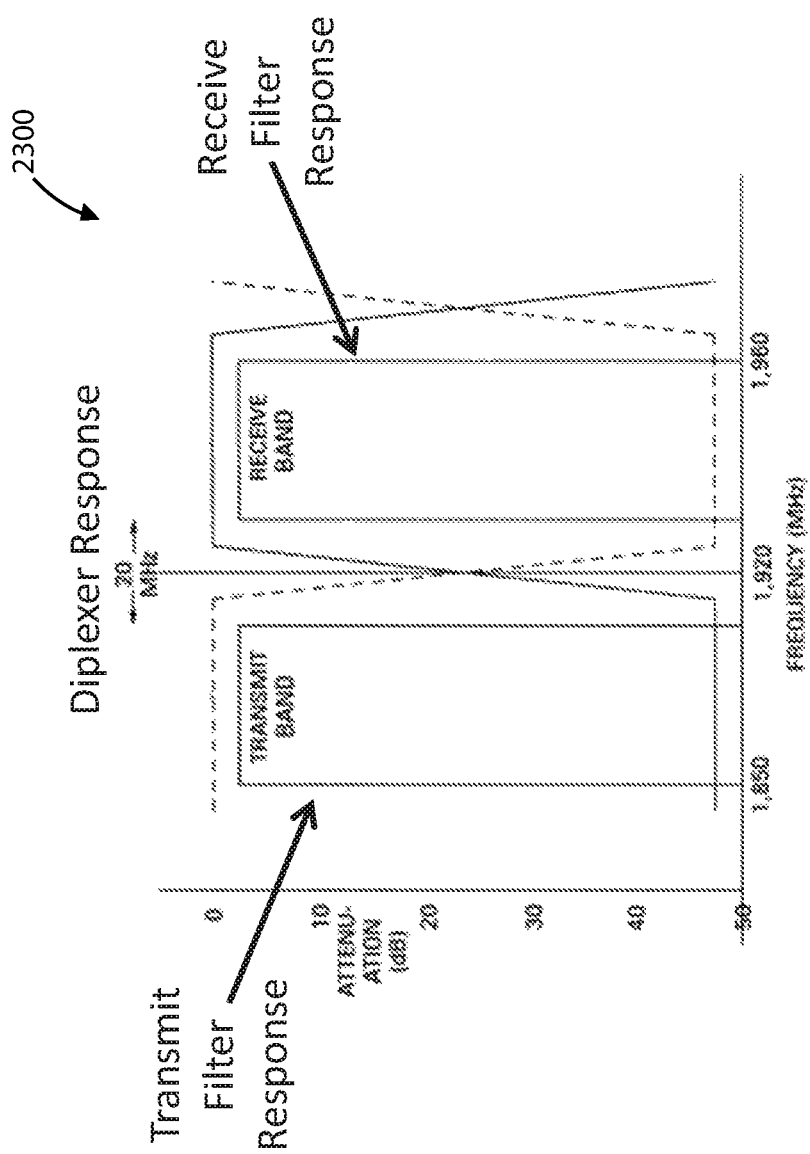
FIG. 23 is an example of filter response in an example of the present invention.

FIG. 23 is an example of filter response in an example of the present invention. As shown, the response graph 2300 shows attenuation plotted against frequency. Attenuation is measured in decibels (dB), and frequency in hertz. The first region represents the transmit filter response, while the second region represents the receive filter response.

Figure 24:
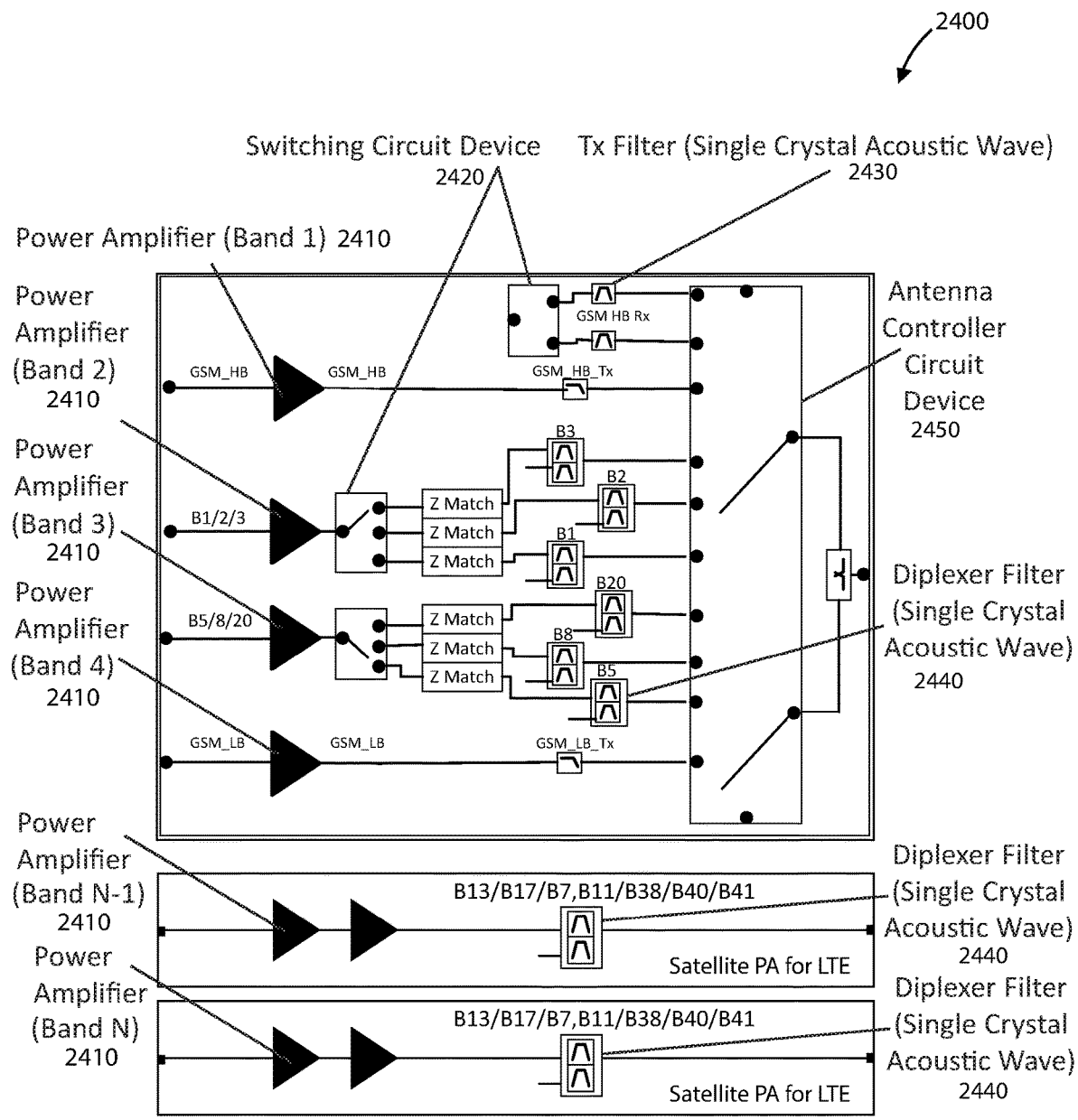
FIG. 24 is a simplified diagram of a smart phone RF power amplifier module according to an example of the present invention.

FIG. 24 is a simplified diagram of a smart phone RF power amplifier module 2400 according to an example of the present invention. In an example as shown is an RF power amplifier module 2410 coupled to a processor device, as described previously in FIGS. 20 and 21. In an example, the RF power amplifier module 2410 is configured to a transmit path and a receive path. Also, any of the power amplifier modules can contain one or more single crystal acoustic wave filters.

In an example, the module has an antenna coupled to the RF power amplifier module 2410. In an example, the module has an antenna control device 2450 configured within the RF power amplifier module 2410. In an example, the control device 2450 is coupled to the receive path and the transmit path, and is configured to select either the receive path or the transmit path.

As shown, the module has a plurality of communication bands 2410 configured within the RF power amplifier module. In an example, the plurality of communication bands are numbered from 1 through N, where N is an integer greater than 2 and less than 50, although there can be variations. In an example, each of the communication bands can include a power amplifier. In an example, the power amplifier is CMOS, GaAs, SiGe process technology, or the like.

In an example, one or more of the communication bands can be configured with a filter device. The filter device 2440 is configured from a single crystal acoustic resonator device. An example of such device can be found in U.S. Ser. No. 14/298,057, commonly assigned, and hereby incorporated by reference herein. The module can have a single crystal acoustic resonator filter device configured with at least one of the plurality of communication bands, as shown. One or more of the communication bands can also be configured with a switching device 2420. The switching device 2420 is coupled to an output impedance matching circuit, as shown. The matching circuit is configured to multiple acoustic wave filters 2440 as shown. The paths are controlled by the switching device. A switching device 2420 can also be coupled to transmit (Tx) filter devices 2430, which are coupled to the antenna controller circuit device 2450. These filter devices 2430 can also be configured from single crystal resonator devices. In an example, the module has a band-to-band isolation between any pair of adjacent communication bands such that a difference between a pass band to reject band as measured in relative decibels (dBc) is greater than 10 dBc and less than 100 dBc. In an example, the module has a control device coupled to the rf power amplifier module.

Figure 25:
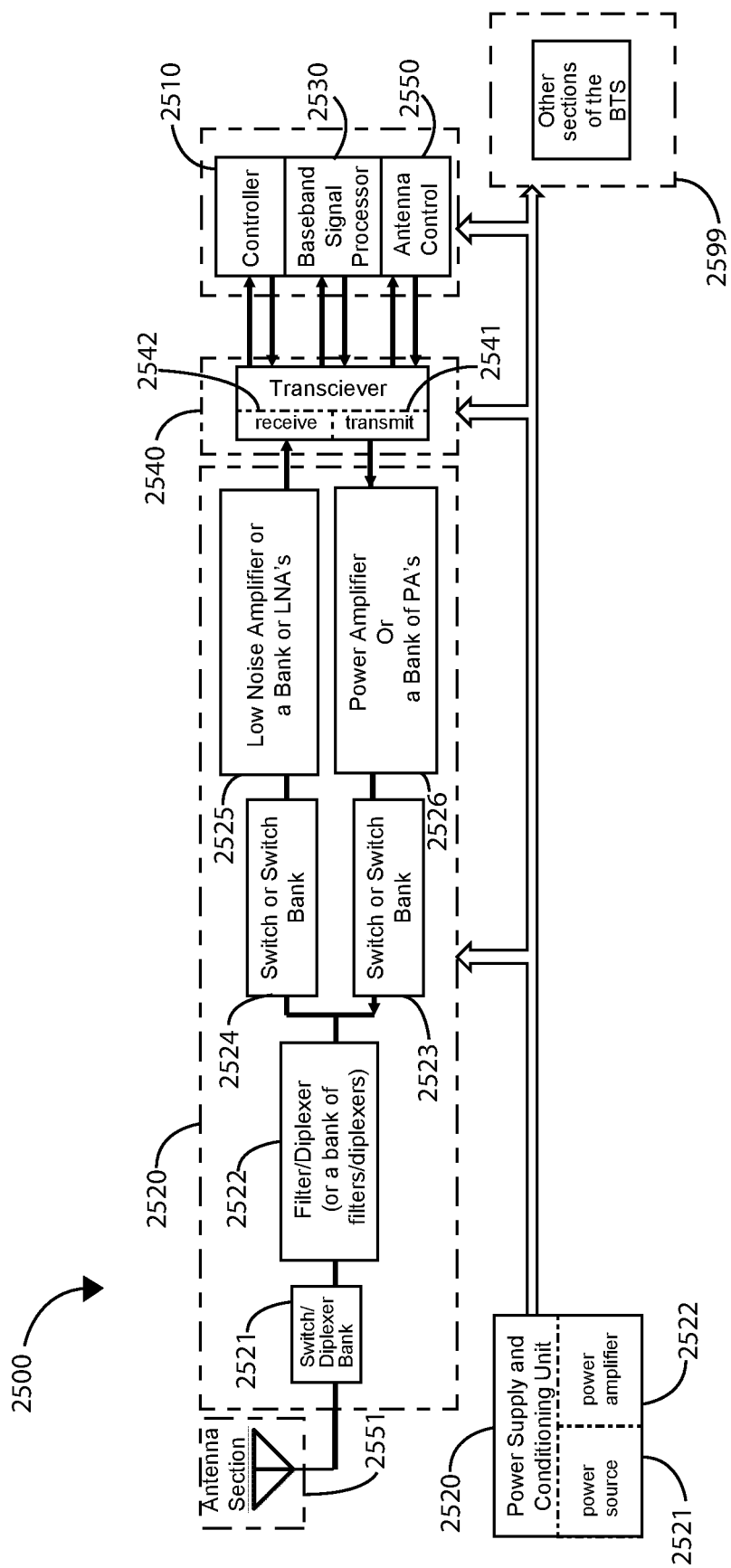
FIG. 25 is a simplified diagram of a fixed wireless communication infrastructure system according to an example of the present invention.

FIG. 25 is a simplified diagram of a fixed wireless communication infrastructure system according to an example of the present invention. The present invention includes specific architectures for wireless communication infrastructure applications using various single crystal piezoelectric devices. Typical infrastructure systems may include controllers, power supplies and/or batteries, cooling infrastructure, transceivers (transmit and/or receive modules), power amplifiers, low-noise amplifiers, switches, antennas, and the like.

As an example, wireless system 2500 includes a controller 2510 coupled to a power source 2521, a signal processing module 2530, and at least a transceiver module 2540. Each of the transceiver modules includes a transmit module 2541 configured on a transmit path and a receive module 2542 configured on a receive path. These paths can be implemented separately or together. The transmit modules 2541 each include at least a transmit filter having one or more filter devices, while the receive modules 2542 each include at least a receive filter. The signal processing module 2530 can be a baseband signal processing module. Further, the transceiver modules 2540 can include RF transmit and receive modules. Those of ordinary skill in the art will recognize other variations, modifications, and alternatives.

Each of these filter (or diplexer) devices includes a single crystal acoustic resonator device. As an example, each device can include a first electrode material, a single crystal material, and a second electrode material. The first electrode material can be coupled to a portion of the substrate. Also, a reflector region can be configured to the first electrode material. The single crystal material can be formed overlying an exposed portion of the substrate surface region and coupled to the first electrode material. The second electrode material can be formed overlying the single crystal material. The structure of these resonator devices can also be similar to those described previously in FIGS. 1A-12E, 15A-15E, and 18A-18C.

Depending on the whether the communication system is a frequency division duplex (FDD) type or time division duplex (TDD) type, the transmit and receive paths may be isolated or shared. In FDD systems, filters are required to separate transmission and reception, thus separating the transmit and receive paths. In TDD systems, since transmission and reception occur in the same channel, there is no need for diplexers to isolate transmission and reception. As shown in FIG. 25, the present invention may have separate channels (FDD system) using filters 2522 or a shared communication channel (TDD system) using diplexers 2522. Those of ordinary skill in the art will recognize other variations, modifications, and alternatives.

An antenna section 2551, having an antenna or an array of antennas, can be coupled to each of the transmit modules 2541 and each of the receive modules 2542. An antenna control module 2550 is coupled to each of the receive path, the transmit path, and the transceiver modules 2540. This antenna control module 2550 is configured to select one of the receive paths or one of the transmit paths in facilitating communication type operations. In an example, the antenna control module 2550 may be physically configured with the controller and/or signal processing module (as shown). Alternatively, the antenna control module 2550 can be physically configured within a front-end module 2520, within the antenna section 2551, or otherwise closer to the antenna section 2551.

In an example, the front-end module 2520 (RF, Bluetooth, or the like) can be coupled to the power supply and conditioning unit 2520 and be configured between the transceiver 2540 and the antenna 2551. A switch bank 2521 can be coupled to the antenna 2551, and the transmit and receive filters can be configured to filter module 2522 (which can be a bank of filters). The filter 2522 can be coupled to two switches (or switch banks) 2523, 2524, that are configured on the transmit path and receive path, respectively. These switches or switch banks can be configured to switch the different paths in or out of the signal flow. On the receive path, switch 2524 can be coupled to a power amplifier 2525 (or bank of PAs) through to the transceiver 2540. On the transmit path, switch 2523 can be coupled to a low noise amplifier 2526 (or bank of LNAs) through to the transceiver 2540.

In an example, the power source 2521 and a power amplifier module 2522 can be part of a power supply and conditioning unit 2520 that is coupled to the controller 2510, the power source 2520, and the transceiver module 2540. The power amplifier module 2560 can be configured on each of the transmit paths and each of the receive paths. This power amplifier module can also include a plurality of communication bands, each of which can have a power amplifier. The filters of the transceiver modules 2540 can each be configured to one or more of the communication bands. The number of filters and switches can vary depending on the number of bands supported and other tradeoffs in the system design. Further, the power supply and conditioning unit 2520 can be coupled to other sections of the wireless system 2500 or base station (BTS) system (represented by block 2599).

One or more benefits are achieved over pre-existing techniques using the present invention. Wireless infrastructures using the present single crystal technology achieves better thermal conductivity, which enables such infrastructures to perform better in high power density applications. The present single crystal infrastructures also provide low loss, thus enabling higher out of band rejection (OOBR). With better thermal properties and resilience over higher power, such single crystal infrastructures achieve higher linearity as well. Depending upon the embodiment, one or more of these benefits may be achieved. Of course, there can be other variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

What is claimed is:
1. A fixed wireless communication system comprising:
a controller;
a power source coupled to the controller;
a baseband signal processing module coupled to the controller;
one or more transceiver modules, each of the transceiver modules comprising
an RF transmit module coupled to the baseband signal processing module and configured on a transmit path, wherein the RF transmit module includes a transmit filter having one or more filter devices, each of the one or more filter devices comprising a single crystal acoustic resonator device;
an RF receive module coupled to the baseband signal processing module, and configured on a receive path, wherein the RF receive module includes a receive filter;
an antenna coupled to each of the RF transmit modules and each of the RF receive modules;
an antenna control device coupled to each of the receive paths and each of the transmit paths, and configured to select one of the receive paths or one of the transmit paths, wherein the antenna control device is coupled to the one or more transceiver modules;
a power amplifier module coupled to the controller, the power source, and the one or more transceiver modules; the power amplifier module being configured on each of the transmit paths and each of the receive paths, wherein the power amplifier module comprises a plurality of communication bands, each communication band having a power amplifier, wherein the one or more filter devices of each transceiver module are configured to one or more of the plurality of communication bands;
wherein each single crystal acoustic resonator devices of the filter devices comprises:
a substrate having a surface region;
a first electrode material coupled to a portion of the substrate;
a reflector region configured to the first electrode material;
a single crystal capacitor dielectric material overlying an exposed portion of the surface region and coupled to the first electrode material; and a second electrode material overlying the single crystal capacitor dielectric material.

2. The system of claim 1 further comprising a cooling module coupled to the power source, the one or more transceiver modules, and the power amplifier module.

3. The system of claim 1 wherein the power source includes a power supply, a battery-based power supply, or a power supply combined with a battery backup.

4. The system of claim 1 configured as a base station, wherein the base station is characterized as macro, micro, nano, pico, or femto, depending on the range, capacity and power capability.

5. The system of claim 1 configured as a Wi-Fi access point.

6. The system of claim 1 wherein the single crystal capacitor dielectric material is selected from at least one of GaN, AlN, AlGaN, ScAlN, ScGaN, InN, BN, or other group III nitrides or at least one of a single oxide including a high K dielectric, ZnO, or MgO; and wherein the semiconductor substrate is selected from a silicon, gallium arsenide, gallium nitride, aluminum nitride, or aluminum oxide; and
wherein the single crystal capacitor dielectric material is characterized by a surface region of at least 200 microns by 200 microns; and wherein the single crystal capacitor dielectric material is configured in a first strain state to compensate to the substrate; wherein the single crystal capacitor dielectric material is deposited overlying the exposed portion of the substrate.

7. The system of claim 1 wherein the first electrode material and the single crystal capacitor dielectric material comprises a first interface region substantially free from an oxide bearing material.

8. The system of claim 1 further comprising a nucleation material provided between the single crystal capacitor dielectric material and the first electrode material;
and further comprising a capping material provided between the single crystal capacitor dielectric material and the second electrode material.

9. The system of claim 8 wherein the single crystal capacitor dielectric material is characterized by FWHM of less than one degree; and wherein the first electrode material comprises a first electrode structure configured and routed to a vicinity of a plane parallel to a contact region coupled to the second electrode material.

10. The system of claim 1 wherein the substrate includes a bare and exposed crystalline material; and wherein the single crystal capacitor dielectric material is configured to propagate a longitudinal signal at an acoustic velocity of 6000 meters/second and greater; and further comprising a first contact coupled to the first electrode material and a second contact coupled to the second electrode material such that each of the first contact and the second contact are configured in a co-planar arrangement.

11. A fixed wireless communication system comprising:
a controller;
a signal processing module coupled to the controller;
one or more transceiver modules coupled to the controller, each of the transceiver modules comprising
a transmit module coupled to the signal processing module and configured on a transmit path, wherein the transmit module includes a transmit filter having one or more filter devices, each of the one or more filter devices comprising a single crystal acoustic resonator device;
a receive module coupled to the signal processing module, and configured on a receive path, wherein the receive module includes a receive filter;

an antenna coupled to each of the transmit modules and each of the receive modules;
an antenna control device coupled to each of the receive paths and each of the transmit paths, and configured to select one of the receive paths or one of the transmit paths, wherein the antenna control device is coupled to the one or more transceiver modules;
wherein each single crystal acoustic resonator devices of the filter devices comprises:
a silicon carbide (SiC) substrate having a surface region;
a first electrode material coupled to a portion of the substrate;
a reflector region configured to the first electrode material;
an aluminum nitride (AlN) single crystal material overlying an exposed portion of the surface region and coupled to the first electrode material; and
a second electrode material overlying the AlN single crystal material.

12. The system of claim 11 further comprising a power amplifier module coupled to the controller, the power source, and the one or more transceiver modules; the power amplifier module being configured on each of the transmit paths and each of the receive paths, wherein the power amplifier module comprises a plurality of communication bands, each communication band having a power amplifier, wherein the one or more filter devices of each transceiver module are configured to one or more of the plurality of communication bands.

13. The system of claim 12 further comprising
a band-to-band isolation between any pair of adjacent communication bands in the plurality of communication bands characterizing each of the transmit filters such that a difference between a pass band to reject band as measured in relative decibels (dBc) is greater than 10 dBc and less than 100 dBc.

14. The system of claim 11 further comprising a power source coupled to the controller, wherein the power source includes a power supply, a battery-based power supply, or a power supply combined with a battery backup.

15. A fixed wireless communications system comprising:
a processing device;
a plurality of transceiver modules, each of the transceiver modules comprising
an RF transmit module coupled to the processing device and configured on a transmit path, wherein the RF module includes a transmit filter having one or more filter devices, each of the one or more filter devices comprising a single crystal acoustic resonator device;
an RF receive module coupled to the processing device, and configured on a receive path, wherein the RF receive module includes a receive filter;
a plurality of antennas coupled to the plurality of transceiver modules, each of the plurality of antennas being coupled to one the RF transmit modules and one of the RF receive modules;
a plurality of antenna control devices coupled to the plurality of antennas, each of the plurality of antenna control devices coupled to one of the receive paths and one of the transmit paths, and configured to select one of the receive paths or one of the transmit paths, wherein the plurality antenna control devices is also coupled to the plurality of transceiver modules;
a power amplifier module coupled to the processing device and the plurality of transceiver modules, the power amplifier module being configured on the transmit path and the receive path of each transceiver module, wherein the power amplifier module comprises a plurality of communication bands, each comprises a plurality of communication bands, each communication band having a power amplifier, wherein the one or more filter devices of each transceiver module are configured to one or more of the plurality of communication bands;

a band-to-band isolation between any pair of adjacent communication bands in the plurality of communication bands characterizing each of the transmit filters such that a difference between a pass band to reject band as measured in relative decibels (dBc) is greater than 10 dBc and less than 100 dBc;

an insertion loss characterizing each of the transmit filters, the insertion loss being less than 3 dB and greater than 0.5 dB; and a center frequency configured to define the pass band;

wherein each single crystal acoustic resonator devices of the filter devices comprises:

a substrate having a surface region;

a first electrode material coupled to a portion of the substrate;

a reflector region configured to the first electrode material;

a single crystal capacitor dielectric material having a thickness of greater than 0.4 microns and overlying an exposed portion of the surface region and coupled to the first electrode material, the single crystal capacitor dielectric material being characterized by a dislocation density of less than $10^{12}$ defects/cm$^2$; and a second electrode material overlying the single crystal capacitor dielectric material.

16. The system of claim 15 wherein the single crystal capacitor material is selected from at least one of GaN, AlN, AlGaN, ScAlN, ScGaN, InN, BN, or other group III nitrides or at least one of a single oxide including a high K dielectric, ZnO, or MgO; and wherein the semiconductor substrate is selected from a silicon, gallium arsenide, gallium nitride, aluminum nitride, or aluminum oxide; and wherein the single crystal capacitor dielectric material is characterized by a surface region of at least 200 microns by 200 microns; and wherein the single crystal capacitor dielectric material is configured in a first strain state to compensate to the substrate; wherein the single crystal capacitor dielectric material is deposited overlying the exposed portion of the substrate.

17. The system of claim 15 wherein the first electrode material and the single crystal capacitor dielectric material comprises a first interface region substantially free from an oxide bearing material.

18. The system of claim 15 further comprising a nucleation material provided between the single crystal capacitor dielectric material and the first electrode material; and further comprising a capping material provided between the single crystal capacitor dielectric material and the second electrode material.

19. The system of claim 18 wherein the single crystal capacitor dielectric material is characterized by FWHM of less than one degree; and wherein the first electrode material comprises a first electrode structure configured and routed to a vicinity of a plane parallel to a contact region coupled to the second electrode material.

20. The system of claim 15 wherein the surface region of the substrate is bare and exposed crystalline material; and wherein the single crystal capacitor dielectric material is configured to propagate a longitudinal signal at an acoustic velocity of 6000 meters/second and greater; and further comprising a first contact coupled to the first electrode material and a second contact coupled to the second electrode material such that each of the first contact and the second contact are configured in a co-planar arrangement.

* * * * *